(12) United States Patent
Tomita et al.

(10) Patent No.: US 11,257,865 B2
(45) Date of Patent: Feb. 22, 2022

(54) RESISTIVE MEMORY

(71) Applicant: Winbond Electronics Corp., Taichung (TW)

(72) Inventors: Yasuhiro Tomita, Taichung (TW); Chi Shun Lin, Fremont, CA (US)

(73) Assignee: WINBOND ELECTRONICS CORP., Taichung (TW)

( * ) Notice: Subject to any disclaimer, the term of this patent is extended or adjusted under 35 U.S.C. 154(b) by 116 days.

(21) Appl. No.: 16/591,944

(22) Filed: Oct. 3, 2019

(65) Prior Publication Data
US 2020/0111836 A1    Apr. 9, 2020

(30) Foreign Application Priority Data
Oct. 3, 2018    (JP) .............................. JP2018-188003

(51) Int. Cl.
*H01L 27/24*    (2006.01)
*H01L 23/528*   (2006.01)
(Continued)

(52) U.S. Cl.
CPC ........ *H01L 27/2463* (2013.01); *G11C 13/004* (2013.01); *G11C 13/0007* (2013.01); *G11C 13/0069* (2013.01); *G11C 13/0097* (2013.01); *H01L 23/528* (2013.01); *H01L 23/5226* (2013.01); *H01L 27/2436* (2013.01); *H01L 45/1233* (2013.01); *H01L 45/146* (2013.01); *G11C 2013/005* (2013.01);
(Continued)

(58) Field of Classification Search
CPC .................................................. H01L 27/2463
See application file for complete search history.

(56) References Cited

U.S. PATENT DOCUMENTS

2006/0146590 A1*  7/2006  Fukushi ............ H01L 27/11507
                                                          365/145
2008/0007993 A1    1/2008  Saitoh et al.

FOREIGN PATENT DOCUMENTS

| JP | 2008-41704 A | 2/2008 |
| JP | 2012-64286 A | 3/2012 |
| KR | 100709538 B1 | 4/2007 |

OTHER PUBLICATIONS

Office Action dated Aug. 25, 2020 in Korean Application No. 10-2019-0119178 (10 pages).
(Continued)

*Primary Examiner* — Christopher A Johnson
(74) *Attorney, Agent, or Firm* — Muncy, Geissler, Olds & Lowe, P.C.

(57) ABSTRACT

The invention provides a resistive memory with better area efficiency without degrading reliability, which includes an array area, word lines, a local bit line, source lines, and a shared bit line. In the array area, memory cells are arranged in a matrix, and each memory cells includes a variable resistance element and an accessing transistor. The word lines extend in a row direction of the array area and are connected to the memory cells in the row direction. The local bit line extends in a column direction of the array area. The source lines extend in the column direction and are connected to first electrodes of the memory cells in the column direction. The shared bit line is connected to the local bit line. The shared bit line extends in the row direction and is connected to second electrodes of the memory cells in the row direction.

11 Claims, 18 Drawing Sheets

(51) Int. Cl.
*H01L 23/522* (2006.01)
*H01L 45/00* (2006.01)
*G11C 13/00* (2006.01)

(52) U.S. Cl.
CPC .... *G11C 2013/009* (2013.01); *G11C 2213/32* (2013.01); *G11C 2213/79* (2013.01)

(56) References Cited

OTHER PUBLICATIONS

LV et al., "Evolution of conductive filament and its impact on reliability issues in oxide-electrolyte based resistive random access memory," Scientific Reports, 2015, pp. 1-6, 6 pages.

* cited by examiner

|  | $V_{BL}$ | $V_{SL}$ | $V_G$ |
|---|---|---|---|
| Forming | + | GND | + |
| Set | + | GND | + |
| Reset | GND | + | ++ |

RESISTIVE MEMORY

CROSS REFERENCE TO RELATED APPLICATIONS

This application claims priority of Japan Patent Application No. 2018-188003, filed on Oct. 3, 2018, the entirety of which is incorporated by reference herein.

BACKGROUND OF THE INVENTION

Field of the Invention

The invention relates to a resistive random-access memory using resistive elements, and more particularly to a structure of a memory array.

Description of the Related Art

For non-volatile memories that replace flash memories, resistive memories using variable resistance elements are attracting attention. It is known that resistive memories are memories whose variable resistance elements are applied by pulse voltages, such that the variable resistance elements reversibly and non-volatilely become a high resistive state or a low resistive state to memorize information. The resistive memories have the following advantages: since data can be overwritten with a low voltage (in a small amount of current), the power consumption is less; since there is a relatively simple structure composed of a transistor and a resistor, the unit area is as small as $6F^2$ (F is the diameter of the wiring, tens of nanometers), and high density can be achieved; and the reading time of the resistive memory is about 10 nanoseconds which is as fast as a DRAM (dynamic random access memory) (Patent Document 1 and Patent Document 2).

For resistive memories, there are a unipolar type and a bipolar type. For the unipolar type, the polarity of the write voltage applied to the variable resistance elements for the setting or resetting is the same, and the setting or resetting is performed by changing the magnitude of the write voltage. For the unipolar type, since the memory array can be made to have an asymmetric structure, it is easy to manufacture. On the other hand, for the bipolar type, the polarity of the write voltage applied to the variable resistance element for the setting is inverted to that for the resetting. That is, the write voltage is applied to the variable resistance elements from two directions. Thus, the symmetry of the circuit is necessary, so that the manufacture of the memory array becomes more complicated than the unipolar type.

FIG. 1A is a circuit diagram showing a configuration of a memory array of a bipolar-type resistive memory disclosed in Non-Patent Document 1. In a memory array 10, a plurality of memory cells are arranged in a two-dimensional array. FIG. 1A only shows the memory cells arranged on three rows and three columns. Each memory cell MC is composed of a variable resistance element and an accessing transistor connected in series with the variable resistance element, which is referred to as a configuration of 1T×1R. The gates of the plurality of accessing transistors are respectively connected to the word lines WL(n−1), WL(n), and WL(n+1), the drain regions thereof are respectively connected to the first electrodes of the variable resistance elements, and the source regions thereof are respectively connected to the source lines SL(n−1), SL(n), and SL(n+1). The second electrodes (the other electrodes) of the variable resistance elements are respectively connected to the bit lines BL(n−1), BL(n), and BL(n+1).

One variable resistance element is made of a thin film oxide of a transition metal such as a hafnium oxide (HfOx), and is set or reset according to the polarity and magnitude of the write pulse voltage. The memory cells can be randomly accessed by taking one bit as the unit. For example, when a memory cell MC is accessed, the word line WL(n) is selected by the column decoder 20 to turn on the access transistor of the memory cell MC, and the bit line BL(n) and the source line SL(n) are selected by the row decoder 30. In the cases of the write operation, the write voltage corresponding to the setting or resetting is applied to the selected bit line BL(n) and the selected source line SL(n). In the cases of the read operation, the voltage or current corresponding to the setting or resetting of the variable resistance element appears on the selected bit line BL(n) and the selected source line SL(n), which are detected by the detection circuit.

Further, in the cases where a thin film of a metal oxide, such as a hafnium oxide (HfOx), is used as the material of the variable resistive elements, it is necessary to perform a forming process on the metal oxide for a starting setting. Usually, the forming process is performed, such that a variable resistance element is close to, for example, a low resistance state by applying a voltage Vf, which is larger than the applied voltage during the write operation of the variable resistance element, to the film. Such forming process is usually performed before the resistance memory is shipped.

An example of the bias voltage at the time of the forming process is shown in FIG. 1B. The voltage $V_{SL}$ applied to the source line SL is the ground voltage GND, the voltage $V_{BL}$ applied to the selected bit line BL is a positive forming voltage, and a positive voltage necessary for turning on the access transistor is applied as the voltage $V_G$ of the word line WL. Thereby, for a variable resistance element, a current flows from the bit line BL to the source line SL, and thus, the variable resistance element is set to a low resistance state. Further, in order to reset a variable resistance element, the voltage $V_{SL}$ of the source line SL is set to a positive voltage, the voltage $V_{BL}$ of the bit line BL is set to the ground voltage GND, and the voltage $V_G$ of the word line WL is set to a positive voltage. Accordingly, a current flows from the source line SL to the bit line BL to reset the variable resistance element to a high resistance state.

PRIOR TECHNICAL DOCUMENTS

Patent Documents

[Patent Document 1] Japan Publication No. 2012-64286
[Patent Document 2] Japan Publication No. 2008-41704
[Non-Patent Document 1] "Evolution of conductive filament and its impact on reliability issues in oxide-electrolyte based resistive random access memory" Hangbing Lv et. al., Scientific Reports 5, Article number: 7764 (2015).

BRIEF SUMMARY OF THE INVENTION

Problems to be Solved by the Invention

A bipolar-type resistive memory requires a bidirectional write voltage to be applied between a bit line and a source line thereby injecting a cell current. It is important to make the write voltages written to all the memory cells uniform, and to obtain a memory with high reliability. Therefore, in the bipolar type, a dedicated source line extending in the same direction as the bit line is configured in a one-to-one relationship with respect to the bit line, so that symmetry in which the bit line and the source line can be replaced with each other is achieved.

However, in such a memory array structure, for example, a dedicated source line is arranged for a bit line, so that when a highly integrated memory is formed, the source line becomes an obstacle to reducing of the width of the memory array in the column direction. In addition, when the bit lines and the source lines are formed in parallel in the same direction and with the same metal layer, the line width of the bit lines/source lines is reduced with miniaturization, and it becomes difficult to achieve the resistance of the source lines. The resistance of the source lines is an important factor for reliable write operation, that is, currents flow through the source lines during the write operation, and one the resistance of the source lines becomes larger, the voltage drop also becomes larger and cannot be ignored. In order to obtain high reliability, it is desirable that a constant read voltage/write voltage is applied to each variable resistance element of the memory array. However, if the voltage drop induced by the source lines becomes large, the degree of the variation in the voltage applied to each variable resistance element becomes large. Therefore, it is preferable to form a source line having a sufficient line width, and, however, the area of the memory array increases (this condition is also occurred even if the bit lines are replaced with the source lines).

An object of the present invention is to provide a resistive random access memory with better area efficiency without degrading reliability.

Means to Solve the Problems

The resistive memory of the present invention is a resistive memory that memorizes data by reversible and non-volatile variable resistance elements. The resistive memory comprises an array area, a plurality of word lines, at least one bit line, a plurality of source lines, and a shared bit line. In the array area, a plurality of memory cells are arranged in a matrix, and each of the plurality of memory cells comprises a variable resistance element and an accessing transistor connected to the variable resistance element. The plurality of word lines extend in a row direction of the array area and are connected to the memory cells in the row direction. The at least one bit line extends in a column direction of the array area. The plurality of source lines extend in the column direction of the array area and are connected to first electrodes of the memory cells in the column direction. The shared bit line is connected to the at least one bit line. The shared bit line extends in the row direction of the array area, and the shared bit line is connected to second electrodes of the memory cells in the row direction.

The resistive memory of the present invention is a resistive memory that memorizes data by reversible and non-volatile variable resistance elements. The resistive memory comprises an array area, a plurality of word lines, a plurality of bit lines, at least one source line, and a shared source line. In the array area, a plurality of memory cells are arranged in a matrix, and each of the plurality of memory cells comprises a variable resistance element and an accessing transistor connected to the variable resistance element. The plurality of word lines extends in a row direction of the array area and are connected to the memory cells in the row direction. The at least one source line extends in the column direction of the array area. The shared source line is connected to the at least one source line. The shared source line extends in the row direction of the array area, and the shared source is connected to second electrodes of the memory cells in the row direction.

Efficacy of the Inventive

According to the present invention, since the array area is composed of shared bit lines or shared source lines, the number of bit lines or source lines extending in the column direction on the array area is reduced, and the size of the array area can be reduced. Moreover, the line width of the bit lines or the source lines can be increased. Thus, it is possible to reduce the resistance of the bit lines or the source lines, to maintain the uniformity in the voltages applied to the memory cells on the array area, and to reliably performing the write operation, the read operation, and the like.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 4A and 4B are plan views showing the configuration of the shared bit lines of the first embodiment of the present invention, wherein FIG. 4A is a plan view showing the case where a polysilicon layer has been formed on the silicon substrate, and FIG. 4B is a plan view showing that a transition metal oxide has been formed as a variable resistance element;

FIGS. 13A and 13B are plan views showing the configuration of the shared source lines of the second embodiment of the present invention, wherein FIG. 13A is a plan view showing the case where a polysilicon layer has been formed on the polysilicon substrate, and FIG. 13B is a plan view showing that a transition metal oxide has been formed as a variable resistance element;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figures 1A, 1B:
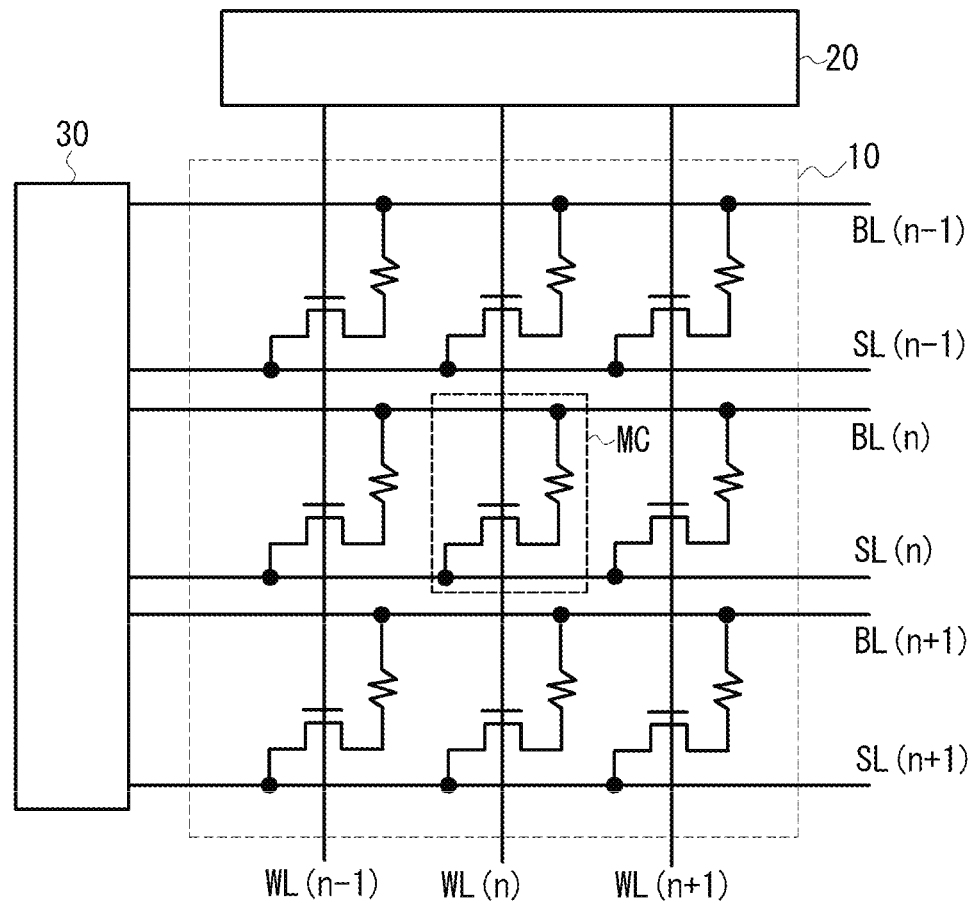
FIG. 1A shows an array configuration of a conventional resistive random access memory.
FIG. 1B is a table showing bias conditions at the time of the operation.
Figure 2:
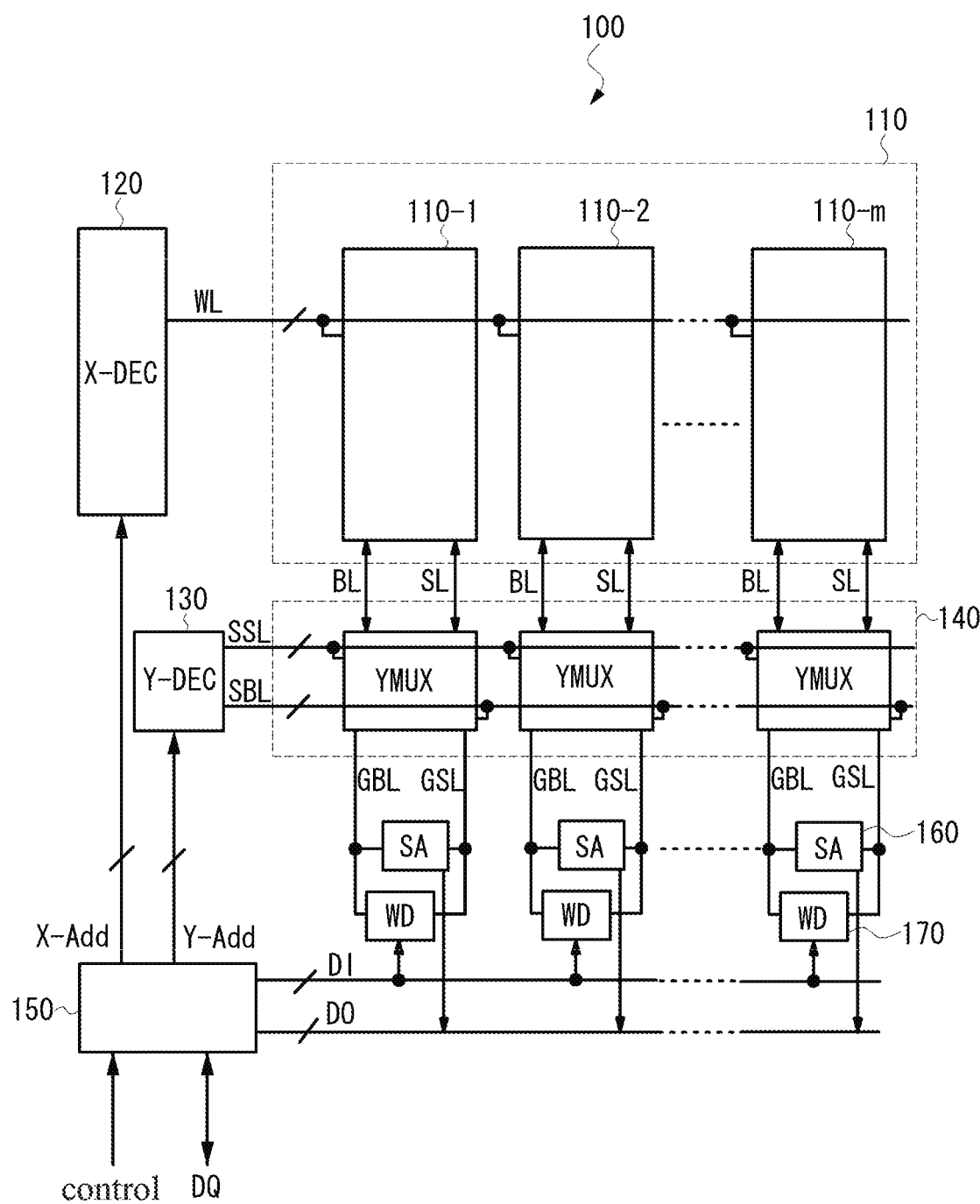
FIG. 2 is a block diagram showing a schematic configuration of a resistive random access memory according to an exemplary embodiment of the present invention.

Referring to FIG. 2, a resistive memory 100 of the present embodiment comprises a memory array 110, a row decoder and driving circuit (X-DEC) 120, a column decoder and driving circuit (Y-DEC) 130, column selection circuits (YMUX) 140, a control circuit 150, sense amplifiers 160, and write driver and read bias circuits 170. The memory array 110 is composed of memory cells arranged in a matrix having columns and rows. Each of the memory cells comprises a variable resistance element and an accessing transistor. The row decoder and driver circuit (X-DEC) 120 selects and drives the word line(s) WL based on a row address X-Add. The column decoder and driver circuit (Y-DEC) 130 generates selection signals SSL and SBL based on a column address Y-add for selecting global bit lines GBL and global source lines GSL. One column selection circuit (YMUX) 140 selects the connection between one global bit line GBL and a corresponding bit line BL and the connection between one global source line GSL and a corresponding source line SL based on the selection signals SSL and SBL, respectively. The control circuit 150 controls each component based on instructions, addresses, data, etc. received from the outside. Each sense amplifier 160 senses the read data of a corresponding memory cell via the corresponding global bit line GBL/select signal SBL. Each write driver and the read bias circuit 170 applies a bias voltage for a read operation via the global bit line GBL/select signal SBL and applies a voltage according to the setting and resetting performed during a write operation.

The memory array 110 comprises m sub-arrays 110-1, 110-2, . . . , 110-m. m column selection circuits (YMUX) 140 correspond to the m sub-arrays 110-1, 110-2, . . . , 110-m and are connected to them, respectively. The m column selection circuits (YMUX) 140 are connected to the sense amplifiers 160 and the write driver and read bias circuits 170, respectively. Each sense amplifier 160 is connected to the control circuit 150 via an internal data bus DO, and the result sensed by the sense amplifier 160 is output to the control circuit 150 via the internal data bus Do. In addition, each write driver and read bias circuit 170 is connected to the control circuit 150 via an internal data bus DI, and each write driver and read bias circuit 170 receives write data via the internal data bus DI.

In the first embodiment of the present invention, the memory array 110 has a configuration in which the bit lines are shared. In the following description, the bit lines and the source lines which extend from the column selection circuits 140 to the memory array 110 and are orthogonal to the word lines WL are referred to as the local bit lines BL and the local source lines SL, respectively. A bit line which extends from the local bit line BL and is in parallel with the word lines WL is referred to as a shared bit line SBL.

Figure 3:
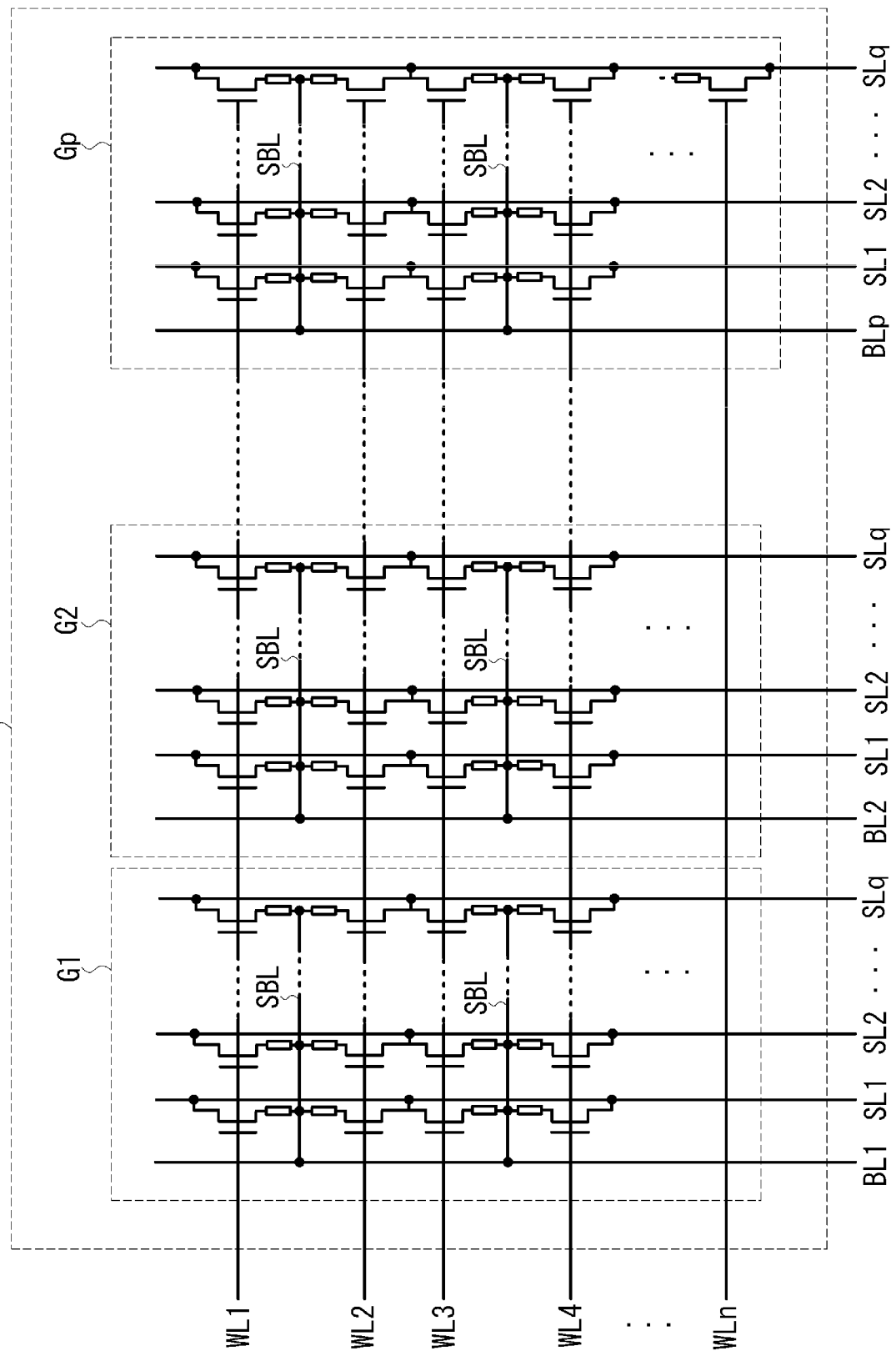
FIG. 3 is a circuit diagram of a portion of a memory array region composed of shared bit lines according to a first embodiment of the present invention.

In FIG. 3, only the k-th sub-array 110-$k$ of the memory array 110 is shown for example. It should be noted that the other sub-arrays have the same configuration.

The sub-array 110-$k$ is divided into p groups G1, G2, . . . , Gp in the row direction, and one group comprises memory cells arranged on n rows and q columns. A memory cell comprises an accessing transistor and a variable resistance element coupled to the accessing transistor in series. The variable resistance element is composed of, for example, a transition metal oxide (TMO). The memory cells are arranged in a matrix by connecting pairs of resistance elements in the column direction in series.

Each of the word lines WL1~WLn extends in the row direction and is commonly connected to the gates of the accessing transistors of the memory cells, which are disposed in the row direction, in the groups G1~Gp. Further, the local bit lines BL and the local source lines SL extend in the column direction, and one local bit line BL is allocated in one group. That is, the local bit lines BL1, BL2, . . . , BLp are allocated in the respective groups G1~Gp. Further, for one local bit line BL, a plurality of shared bit lines SBL extending in parallel with the word lines are connected to the local bit line BL. As shown in FIG. 3, each shared bit line SBL is connected to the variable resistance elements of pairs of memory cells in the row direction, so that a short circuit is made between q nodes in the row direction to which the variable resistance elements of those pairs of memory cells are commonly connected. At this time, if there are n word lines in one group, n/2 shared bit lines SBL are formed in the same group. In other aspects, it is not necessary to share one shared bit line by a pair of memory cells as shown in FIG. 3. In another embodiment, a shared bit line SBL may be connect to the memory cells in the row direction by a short-circuit connection manner. That is, one shared bit line SBL extending in the row direction as shown in FIG. 3 is replaced with two shared bit lines extending in the row direction. At this time, n shared bit lines SBL are formed in one group, and, compared with the embodiment where n/2 shared bit lines are formed in one group, the parasitic capacitance of the array can be reduced. One local source line SL is commonly connected to the accessing transistor of the memory cells in the column direction. Further, in the embodiment, one column line connected to the variable-resistance-element sides of the memory cells is used as the bit line, and one column lines connecting the accessing transistors on the opposite side are used as the source line.

In the following, a structure of a memory array composed of shared bit lines is taken as an example for description. The memory array has a multilayer wiring structure on a silicon substrate. In the embodiment, there are three metal layers and one conductive polysilicon layer on the silicon substrate (metal layers 1, 2, and 3 are defined in the direction from the silicon-substrate side). The metal layers, the via contacts, and the like comprise, for example, a metal such as Al or Cu, a high melting point silicide layer, or the like.

Figure 4A:
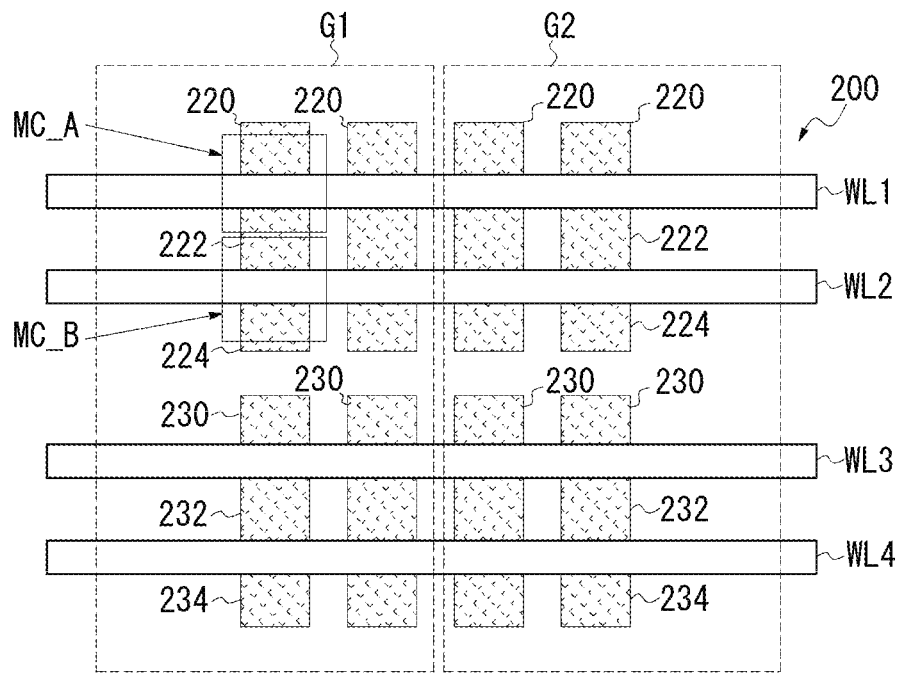

First, as shown in FIG. 4A, for example, strip-shaped polysilicon layers extending in the column direction are formed on the surface of the p-type silicon substrate 200 via a gate oxide film, and N+ impurities diffusion regions 220, 222, 224, 230, 232, 234 are formed and integrated with the respective polysilicon layers. As shown in FIGS. 6A, 6B, 7A, and 7B, each of the diffusion regions is separated from each other by, for example, trench isolations 210.

Figure 4B:
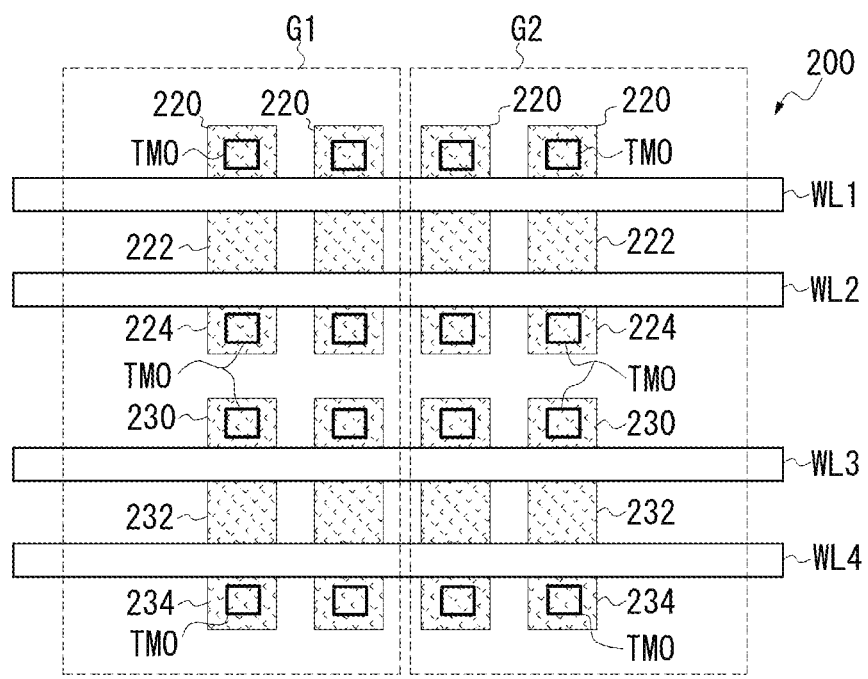

In FIG. 4, four polysilicon layers are illustrated. The four polysilicon layers constitute word lines WL1, WL2, WL3, and WL4 and also constitute gate electrodes of the accessing transistors of the memory cells. For example, the accessing transistor of the memory cell MC_A is composed of the word line WL1 and the diffusion regions 220 and 222, and the accessing transistor of the memory cell MC_B is composed of the word line WL2 and the diffusion regions 222 and 224. The diffusion region 222 is common to the accessing transistors of the memory cells MC_A and MC_B. Thus, the region for sixteen memory cells is shown in FIG. 4A.

Next, as shown in FIGS. 6A, 6B, and 7A and 7B, a first metal layer M1 which is an upper layer than the polysilicon layer is formed. The first metal layer M1 is electrically connected to the diffusion regions 220, 222, 224, 230, 232, and 234 through the via contacts V1 formed in the interlayer dielectric film.

Then, a transition metal oxide TMO which serves as the variable resistance elements of the memory cells is formed. The transition metal oxide TMO is formed on the metal layer M1 connected to the diffusion regions 220, 224, 230, and 234 on the bit-line side of the accessing transistors, as shown in FIGS. 4B, 6A, 6B, 7A, and 7B. Openings reaching the metal layer M1 above the diffusion regions 220, 224, 230, 234 are formed in the interlayer dielectric covering the metal layer M1, and via contacts C2 are formed in the openings, such that the transition metal oxide TMO is electrically connected to the via contacts C2. On the metal layer M1 above the diffusion regions 222 and 232 formed on the source-line side of the accessing transistors, via contacts C2 are formed, but no transition metal oxide TMO is formed.

Figure 5A:
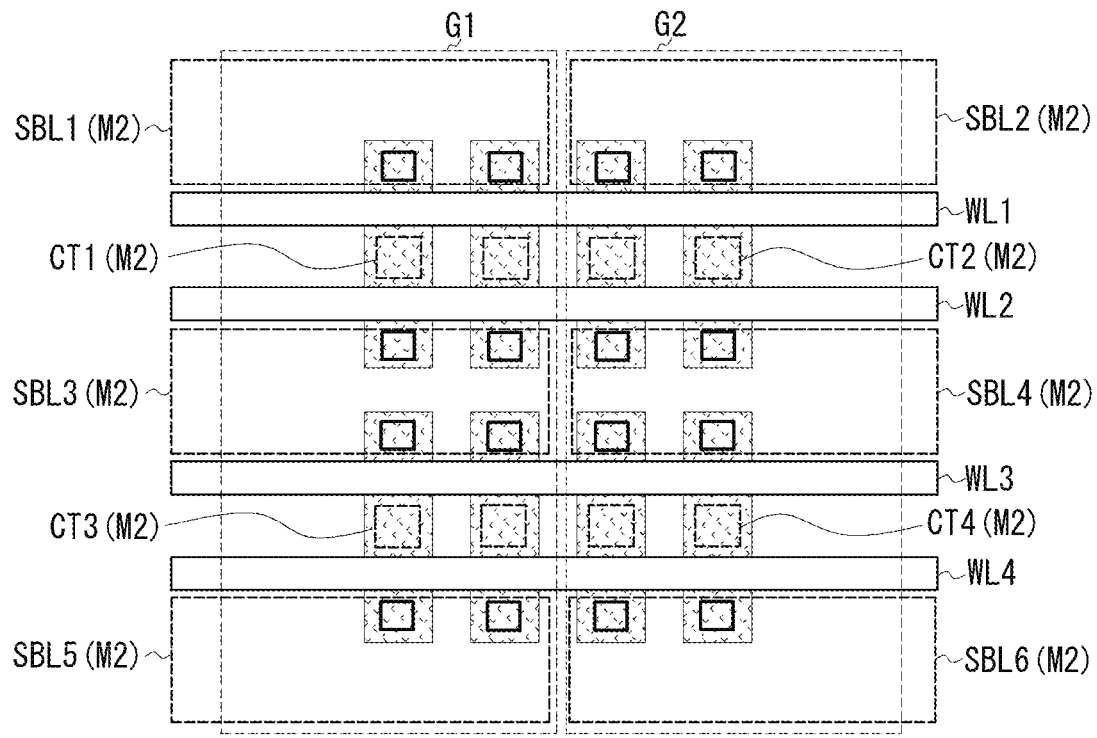
FIG. 5A is a plan view showing that a second metal layer M2 has been formed.

Next, as shown in FIG. 5A, a second metal layer M2 which is an upper layer than the metal layer M1 is formed. In the figures, the second metal layer M2 is indicated by dotted lines. Two shared bit lines SBL1 and SBL2 extending in the row direction are formed above the diffusion regions 220 of the groups G1 and G2. The shared bit line SBL1 serves as a bit line which is for the q accessing transistors associated with the word line WL1 of the group G1 and is also shared by these q accessing transistors, and the shared bit line SBL2 serves as a bit line which is for the q accessing transistors associated with the word line WL1 of the group G2 and is also shared by these q accessing transistors. The shared bit line SBL1 and the shared bit line SBL2 are separated from each other by the boundary portion of the groups G1 and G2.

Two shared bit lines SBL5 and SBL6 extending in the row direction are also formed above the diffusion regions 234 of the groups G1 and G2. The shared bit line SBL5 serves as a bit line which is for the p accessing transistors associated with the word line WL4 of the group G1 and is also shared by these p accessing transistors, and the shared bit line SBL6 serves as a bit line which is for the p accessing transistors associated with the word line WL4 of the group G2 and is also shared by these p accessing transistors. The shared bit line SBL5 and the shared bit line SBL6 are separated from each other by the boundary portion of the groups G1 and G2.

Further, two shared bit lines SBL3 and SBL4 extending in the row direction are also formed above the diffusion regions 222 and 224 of the groups G1 and G2. The shared bit line SBL3 serves as a bit line which is for the p accessing transistors associated with each of the word lines WL2 and WL3 of the group G1 and is also shared by these accessing transistors, and the shared bit line SBL4 serves as a bit line which is for the p accessing transistors associated with each of the word lines WL2 and WL3 of the group G2 and is also shared by these accessing transistors. The shared bit line SBL3 and the shared bit line SBL4 are separated from each other by the boundary portion of the groups G1 and G2. The shared bit lines SBL3 and SBL4 shown in FIG. 5A are not necessarily shared in the diffusion regions 224 and 230, that is, the shared bit lines SBL1~SBL6 are not necessarily shared in the diffusion regions of pairs of memory cells as shown in FIG. 5C. The shared bit lines may be formed on respective diffusion regions. The shared bit line SBL1 is divided into shared bit lines SBL1A and SBL1B, the shared bit line SBL2 is divided into shared bit lines SBL2A and SBL2B, the shared bit line SBL3 is divided into shared bit lines SBL3A and SBL3B, the shared bit line SBL4 is divided into the shared bit lines SBL4A and SBL4B, the shared bit line SBL5 is divided into the shared bit lines SBL5A and SBL5B, and the shared bit line SBL6 is divided into the shared bit lines SBL6A and SBL6B. The shared bit lines SBL1, SBL2, SBL3, SBL4, SBL5, and SBL6 shown in FIG. 5A are commonly used by the separated diffusion regions 224 and 230. Thus, compared with the shared bit lines SBL1A, SBL1B~SBL6A, SBL6B shown in FIG. 5C, the bit lines shown in FIG. 5A are formed with a wide width. However, in this case, attention should be paid to the increase in wiring capacitance.

Relay contacts CT1 and CT2 are formed above the diffusion regions 222 of the groups G1 and G2, and relay contacts CT3 and CT4 are formed above the diffusion regions 232 of the groups G1 and G2. The relay contacts CT1, CT2, CT3, and CT4 are connected to the first metal layer M1 through the via contacts V2 and C2 as shown in FIGS. 6A, 6B, 7A, and 7B (except the relay contacts directly under the bit line BL2).

Figure 5B:
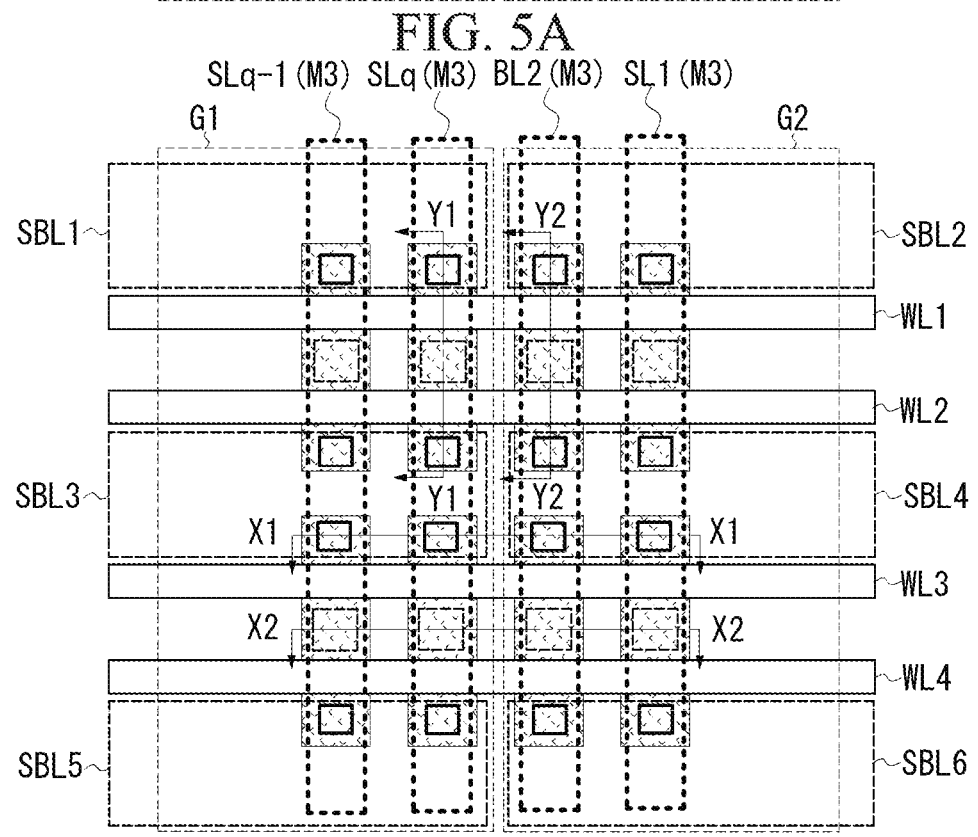
FIG. 5B is a plan view showing that a third metal layer M3 has been formed.
Figure 5C:
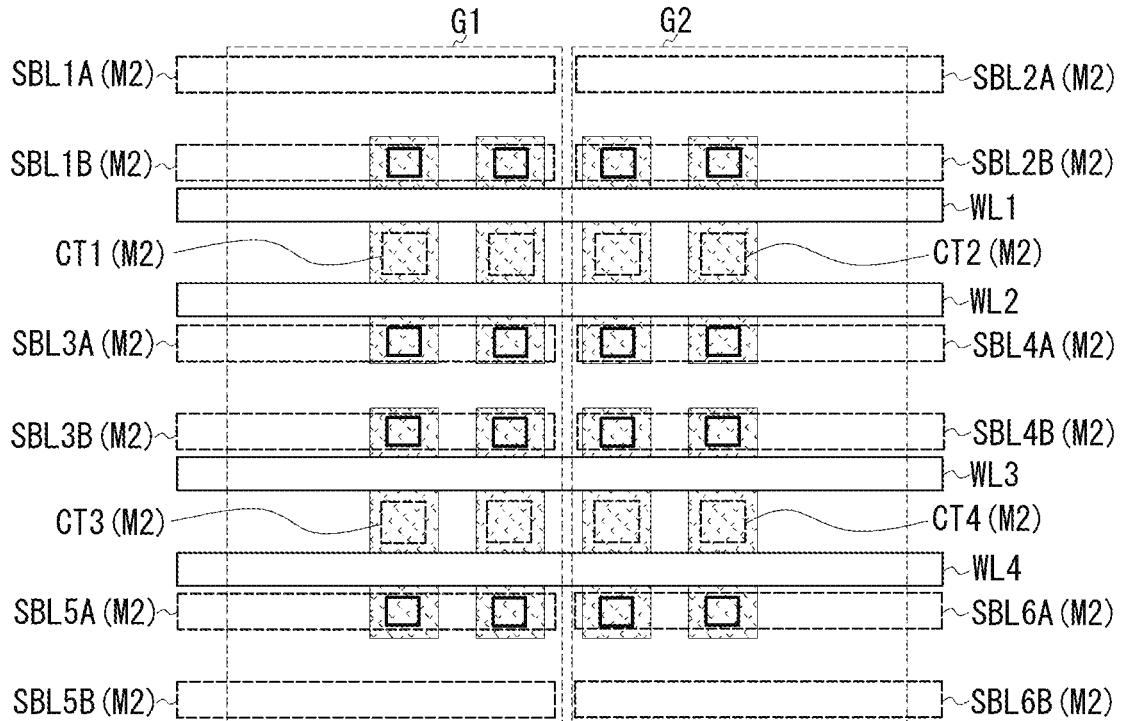
FIGS. 5C and 5D are plan views showing the case where the each of the shared bit lines shown in the FIGS. 5A and 5B is not shared by a pair of memory cells.
Figure 5D:
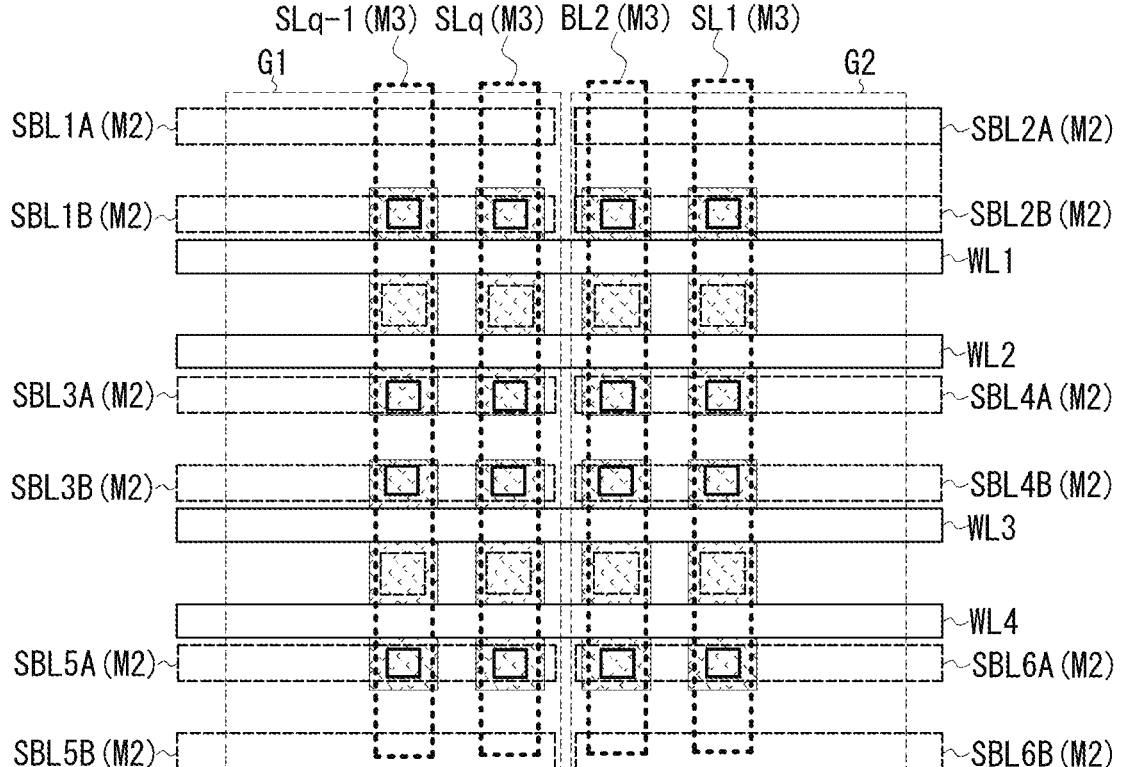

Next, as shown in FIGS. 5B and 5D, for the structures shown in FIGS. 5A and 5C, a third layer M3 which is an upper layer than the second metal layer M2 is formed. The third metal layer M3 extends in a strip shape in the column direction to form the local bit lines BL and local source lines SL. The local source lines SLq−1 and SLq of the group G1 and the local bit line BL2 and the local source line SL1 of the group G2 are shown in the figures.

Figure 6A:
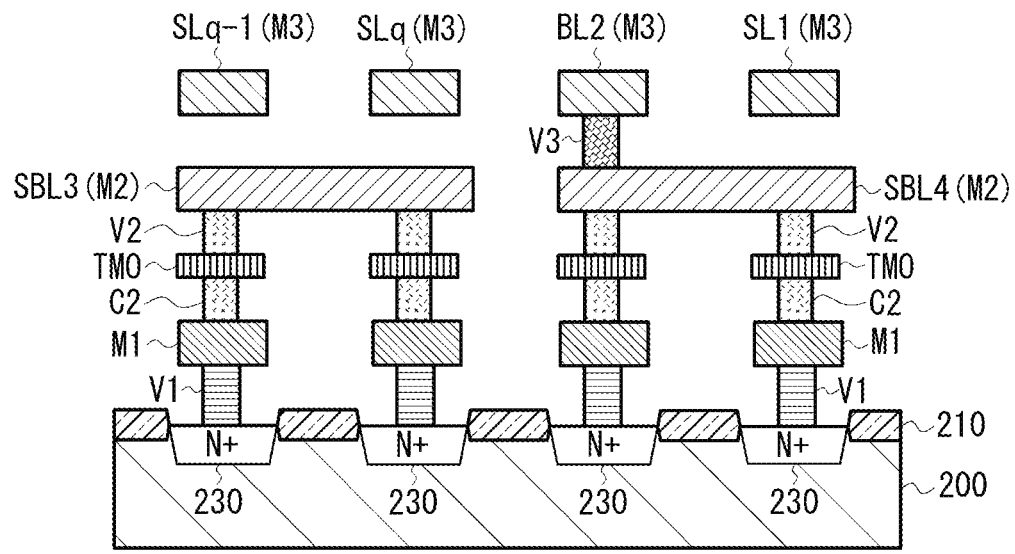
FIG. 6A is a cross-sectional view taken along a line X1-X1 of FIG. 5B.
Figure 6B:
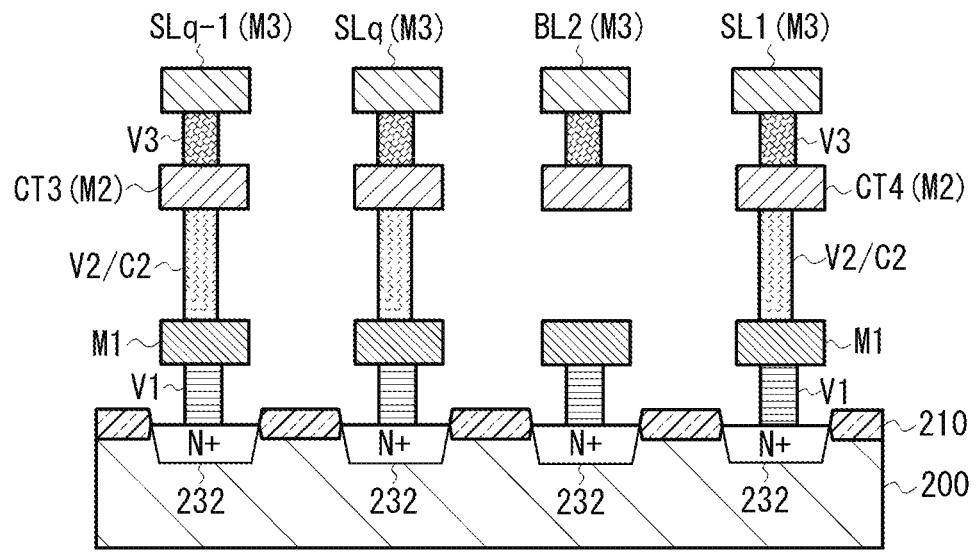
FIG. 6B is a cross-sectional view taken along a line X2-X2 of FIG. 5B.
Figure 7A:
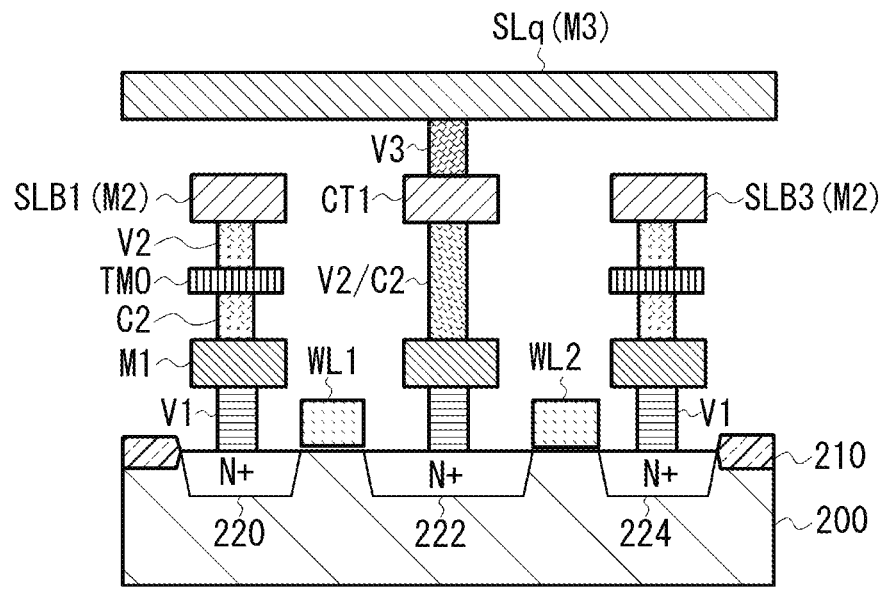
FIG. 7A is a cross-sectional view taken along a line Y1-Y1 of FIG. 5B.
Figure 7B:
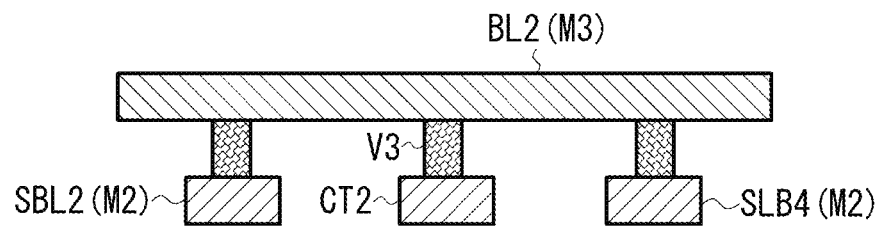
FIG. 7B is a cross-sectional view taken along a line Y2-Y2 of FIG. 5B.
Figure 7B:
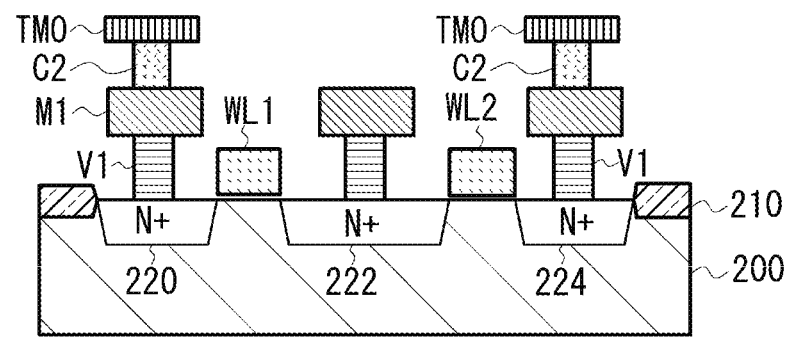

As shown in FIGS. 6A and 6B, the local source lines SLq−1, SLq, and SL1 are electrically connected to the diffusion regions (source regions) 222 and 232 through the via contacts V3, the relay contacts CT1, CT2, CT3, and CT4, and the via contacts V2 and C2. The via contact V3 is not formed at the intersection of the local source lines SLq−1, SLq, and SL1 and the shared bit lines SBL1~SBL6. That is, there is no contact between the local source lines SLq−1, SLq, and SL1 and the shared bit lines SBL1~SBL6.

The local bit line BL2 is electrically connected to the shared bit lines SBL2, SBL4, and SBL6 through the via contacts V3. Further, the shared bit lines SBL1, SBL3, and SBL5 of the group G1 are electrically connected to the local bit line BL1 of the group G1, which is not shown in the figures, through the via contacts V3.

It should be noted here that the local bit line BL2 is electrically connected to the shared bit lines SBL2, SBL4, and SBL6, and it is not necessary that the local bit line BL2 is connected to a metal layer or a transition metal oxide or the like other than the above. That is, the local bit line BL2 is a dummy column line, and the memory cells located below the local bit line BL2 are dummy memory cells without functions. In this example, since no via contacts V2 are formed between the shared bit line SBL2, SBL4, and SBL6 connected to the local bit line BL2 and the transition metal oxide TMO, there is no contact between the local bit line BL2 and the memory cells which are disposed directly below the local bit line BL2, however, this structure is just an example. In another embodiment, other via contacts can be removed to make the local bit line BL2 not contact with the memory cells which are disposed directly below it.

Figure 8A:
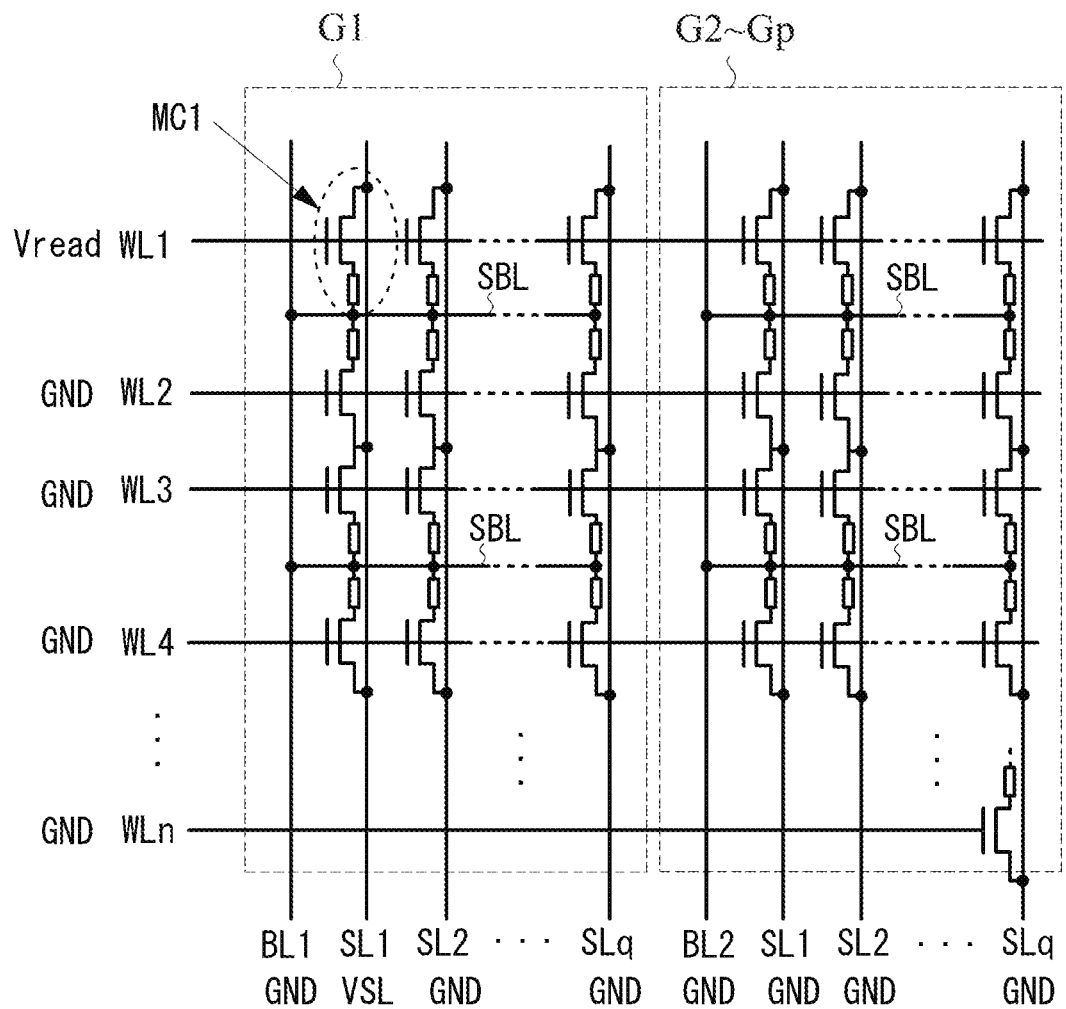
FIGS. 8A and 8B are schematic diagrams showing a read operation of the resistive random access memory according to the first embodiment of the present invention.
Figure 8B:
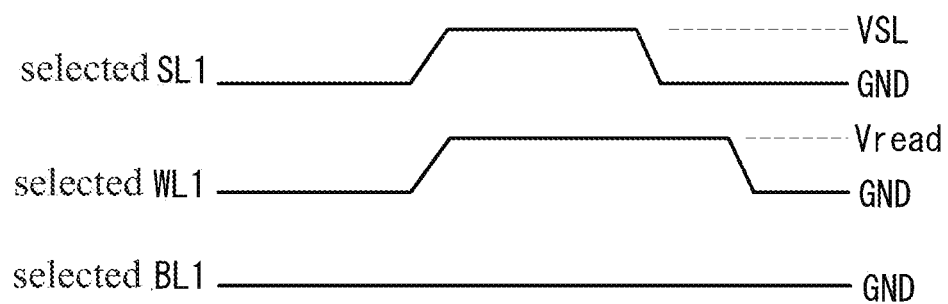

In the following, the operation of the resistive memory of the present embodiment will be described with reference to FIGS. 8A, 8B and 2. First, a read action is explained. FIGS. 8A and 8B show the bias conditions and timing charts of the waveforms of the applied voltages for the selected group and the unselected groups in the read mode. Here, it is assumed that the group G1 is selected, and the memory cell MC1 is selected by the word line WL1, the local bit line BL1, and the local source line SL1 of the group G1.

The column decoder and driver circuit 130 outputs the selection signals SBL/SLL, which are applied for selecting the global bit line GBL and the global source line GSL, to the column selection circuits 140 based on the column address Y-Add. A column selection circuit 140 is enabled in response to the selection signals SBL/SLL, and the remaining column selection circuits 140 are disabled. The enabled column selection circuit 140 selects one sub-array from the memory array 110, and further selects a connection between the global bit line GBL and the local bit line BL and a connection between the global source line GSL and the local source line SL in a group which is selected from the selected sub-array. In addition, the row decoder and drive circuit 120 selects the word line WL1 based on the row address X-Add.

As shown in FIG. 8A, in the selected group G1, the write driver and read bias circuit 170 applies 0V or the ground voltage GND to the local bit line BL1, applies a read voltage VSL to the local source line SL1, and applied 0V or the ground voltage GND to the source lines SL2 to SLq other than the above. Moreover, the write driver and read bias circuit applies 0V or the ground voltage GND to all of the bit lines BL2~BLp and the local source lines SL2~SLq of the unselected groups G2~Gp. Further, the row decoder and drive circuit 120 applies a read voltage Vread to the selected word line WL1 and applies the ground voltage GND to the unselected word lines.

As shown in FIG. 8B, a read voltage Vread is applied to the selected word line WL1, a read voltage VSL is applied to the selected local source line SL1, and the ground voltage GND is applied to the selected local bit line BL1. At this time, the shared bit line SBL connected to the selected local bit line BL1 is also at the level of the ground voltage GND. Accordingly, the accessing transistor of the selected memory cell MC1 is turned on. If the variable resistance element is in a low resistance state (set), there is a larger current from the global source line GSL/local source line SL1 to the shared bit line SBL, the local bit BL1, and the global bit line GBL. On the other hand, if the variable resistance element is in a high resistance state (reset), there is almost no current flowing in the global bit line GBL. The sense amplifier 160 senses the voltage or current of the global bit line GBL, and outputs the data "0" and "1", which is obtained based on the sensing result, by the DQ. In addition, the accessing transistors of the memory cells in the same row as the selected memory cell MC1 are turned on. However, since the voltages of the unselected local source lines SL2~SLq and the voltage of the shared bit line SBL are at the same level, there is no current flowing between the unselected local source lines and the selected local bit line. Further, in the cases where the data is read from the selected local source line, the parasitic capacitance of the selected local source line SL1 is substantially smaller than that of the selected local bit line BL1. Thus, compared with the cases where the data is read from the local bit line BL1, it can be implemented at high speed and low current consumption.

Figure 9A:
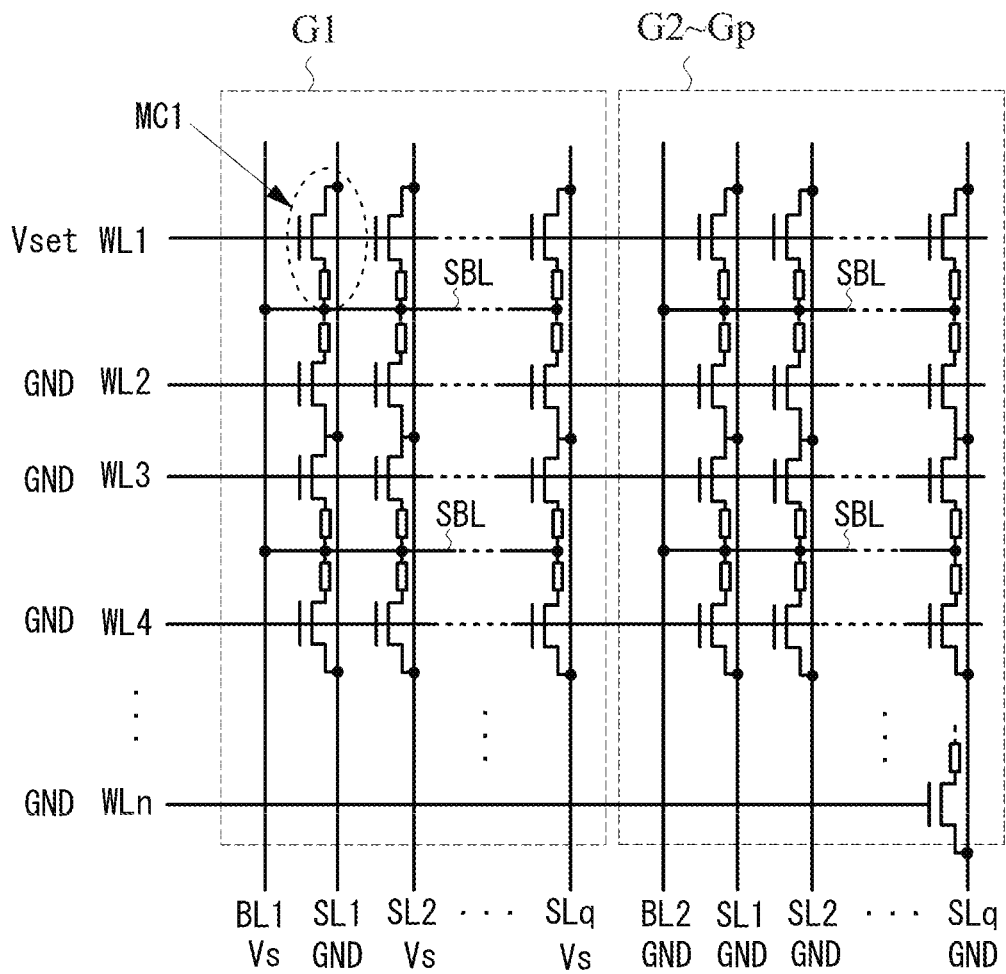
FIGS. 9A and 9B are schematic diagrams showing a write operation of the resistive random access memory according to the first embodiment of the present invention.

Next, the write operation will be described with reference to FIG. 9A. "SET writing" is an operation mode in which a variable resistance element is written in a low resistance state. In the mode "SET writing", the write driver and read bias circuit 170 applies a write voltage Vs to the local bit line BL1 the unselected local source lines SL2~SLq of the selected group G1 and further applies a write pulse with having the amplitude of the write voltage Vs to the selected local source SL1. A write voltage Vset (Vset>Vs) is applied to the selected word line WL1, and the ground voltage GND is applied to the unselected word lines. In addition, all of the local bit lines and the local source lines of the unselected groups G2~Gp are at the level of the ground voltage GND or the same potential.

Figure 9B:
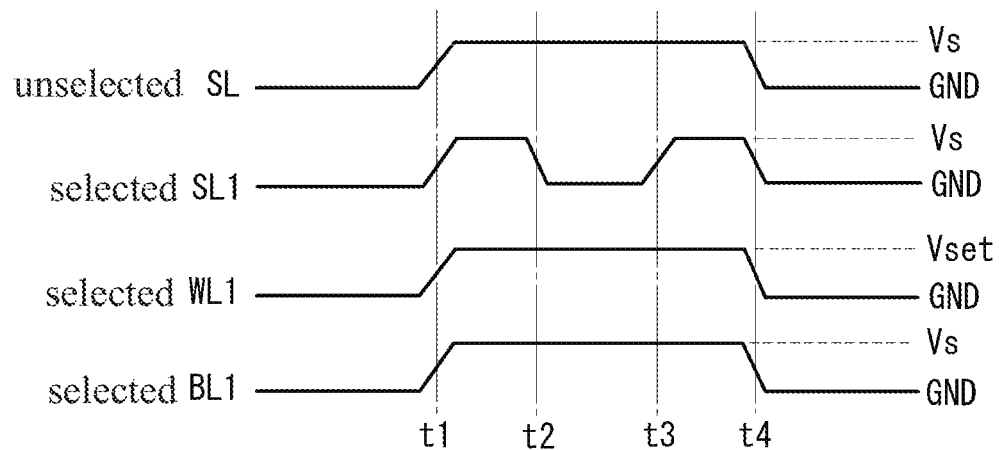

As shown in FIG. 9B, at the time point t1, the write voltage Vs is applied to the selected local source line SL1, the unselected local source lines SL2~SLq, and the selected local bit line BL1, and the write voltage Vset is applied to the selected word line WL1. At this time, the write voltage Vs is also applied to the shared bit line SBL connected to the selected local bit line BL1. In the case where the write voltage Vset is applied to the selected word line WL1, the accessing transistors which are disposed in the row direction and connected to the selected word line WL1 are turned on. However, since the voltage of the shared bit line SBL and the voltage of the local source lines SL1~SLq are controlled to be at the same level, the bias voltage for the mode "SET writing" is not applied to the variable resistance elements of the memory cells associated with the selected word line WL1.

Next, during the period from the time point t2 to the time point t3, the potential of the selected local source line SL1 drops to the level of the ground voltage GND from the level of the write voltage Vs. Accordingly, the bias voltage which is equal to the write voltage Vs is applied to the variable resistive element of the selected memory cell MC1 from the shared bit line SBL. During the period from the time point T2 to the time point T3, and the mode "SET writing" is performed on the variable resistance element. The period from the time point T2 to the time point T3 is set to be a period sufficient for the procedure of the mode "SET writing". At the time point t3, the potential of the selection local source line SL1 rises again to the write voltage Vs, and the bias voltage applied to the variable resistance element is stopped. At the time point T4, all the voltages are lowered to the level of the ground voltage GND.

The mode "RESET writing" is an operation mode in which a variable resistance element is written in a high resistance state. In the mode "RESET writing", the write driver and read bias circuit 170 applies the level of the ground voltage GND to the local bit line BL1 and the unselected local source lines SL2~SLq of the selected group G1 and applies the write voltage Vr to the selected local source line SL1. A write voltage Vreset (Vreset>Vr) is applied to the selected word line WL1, and the ground voltage GND is applied to the unselected word lines. Further, all of the local bit lines and the local source lines of the unselected groups G2~Gp are at the ground voltage GND.

Figure 10A:
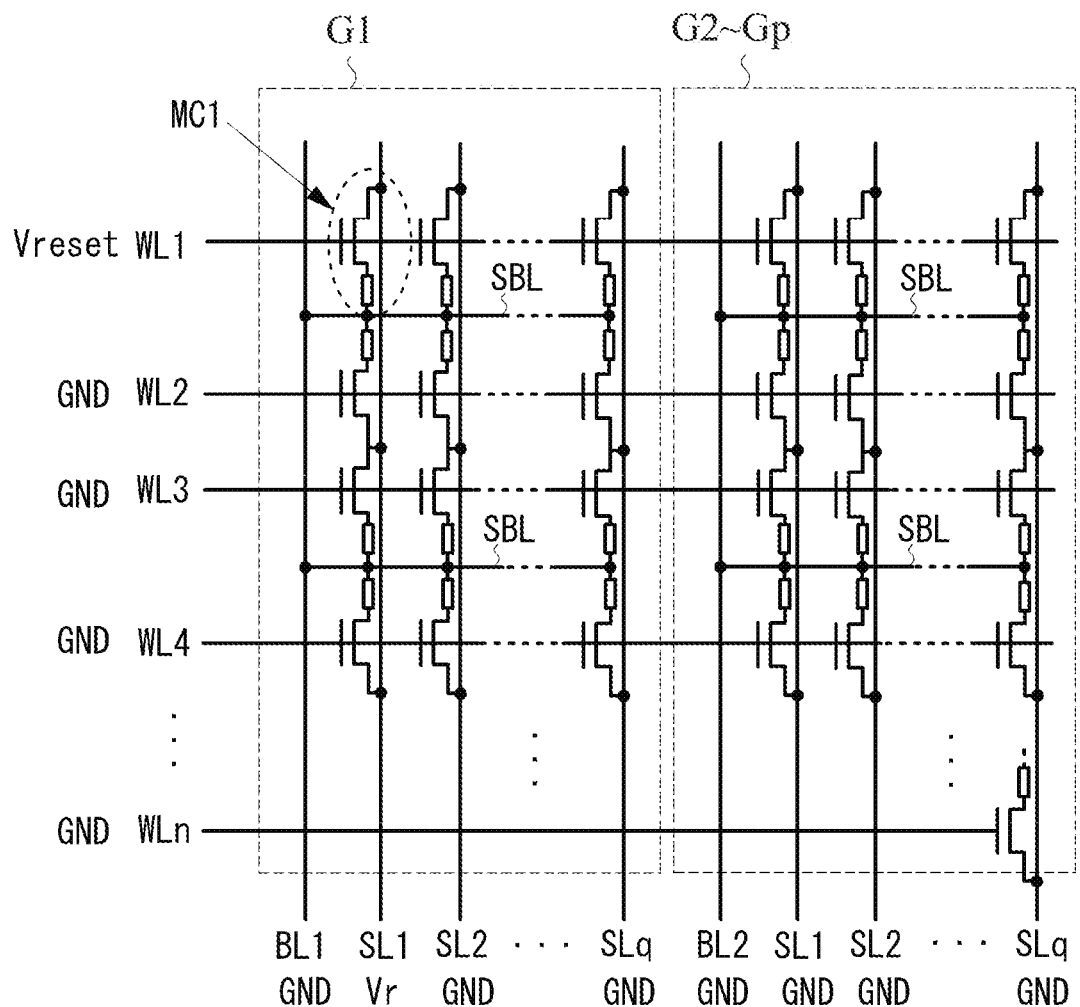
FIGS. 10A and 10B are schematic diagrams showing a resetting write operation of the resistive random access memory according to the first embodiment of the present invention.
Figure 10B:
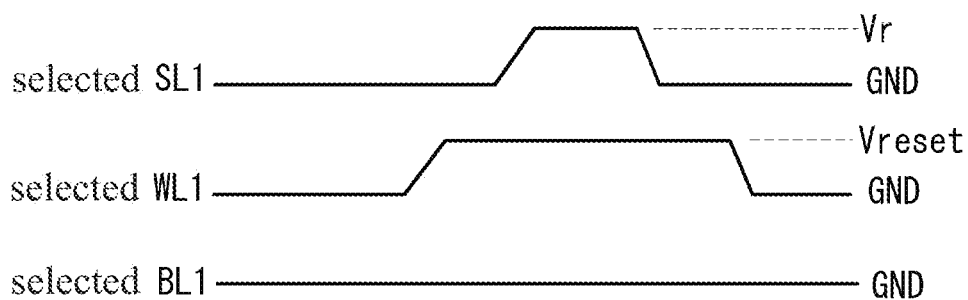

As shown in FIG. 10B, the RESET write voltage Vreset is applied to the selected word line WL1, then, the write voltage Vr is applied to the selected local source line SL1, and the ground voltage GND is applied to the selected local bit line BL1. At this time, the shared bit line SBL and the local bit line BL1 are at the same potential. In the case where the RESET write voltage Vreset is applied to the selected word line WL1, the accessing transistors which are disposed in the row direction and connected to the selected word line WL1 are turned on, and the bias voltage for the mode "RESET writing" is applied to the variable resistive element of the selected memory cell. On the other hand, since the ground voltage GND is applied to the unselected local source lines SL2~SLq, a bias voltage for the mode "RESET writing" is not applied to the variable resistance elements of the unselected memory cells.

Thus, according to the present embodiment, the shared bit lines are configured in the memory array, so that a local bit line is shared by several memory cells. Compared with the prior arts where the bit lines are configured in a one-to-one relationship, the area efficiency of the memory array of the present embodiment can be improved. Further, the memory array is divided into a plurality of groups. Through enabling the sense amplifier 160 and the write driver and the read bias circuit 170 which are connected to the selected group and disabling the other circuits, it is possible to reduced power consumption. Further, in the above embodiment, since the local bit line is separated from the memory cells disposed directly below local bit line and is further used as a dummy line, there is no need to change the layout of the memory cells, in other words, there is no node to provide dedicated space for the local bit line, which can contribute to space saving of the memory array.

Figure 11:
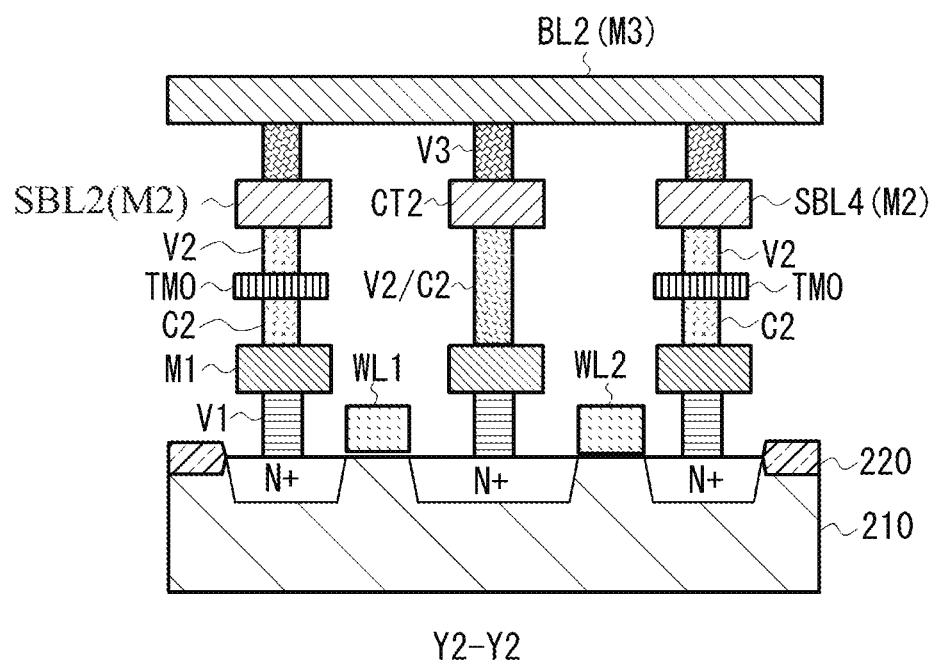
FIG. 11 is a cross-sectional view showing a modification of a dummy line for shared bit lines of the first embodiment of the present invention.

Next, a modification of the first embodiment of the present invention will be described. In the above embodiment, since the local bit line is separated from the memory cells which are disposed directly below the local bit line, the via contacts V2/C2 are not formed. In this case, if the via contacts are not formed in a partial area of the memory array, there is a possibility that the dimensional accuracy of the surrounding memory cells is adversely affected. Therefore, in the modification, as shown in FIG. 11, the local bit line BL2 is connected to the memory cells, which are disposed below the local bit line BL2, through the via contacts V2/C2 whose size is the same as the memory cells. That is, there is a short circuit formed between the shared bit lines SBL2 and SBL4 and the transition metal oxide TMO through the via contacts V2, and there is a short circuit formed between the relay contact CT2 and the metal layer M1 through the via contacts V2/C2, so that, the formation of the memory cells including the dummy cell can be made uniform. Since these is a short circuit formed between the corresponding bit line and source line, the dummy memory cell does not affect the write operation and the read operation. Also, the dummy memory cell can obtain a special effect as follows: the damage of the transition metal oxide TMO can be reduced by the diffusion of the source line, wherein the damage of the transition metal oxide TMO is caused by the charge convergence due to the antenna effect which is induced when the local bit line BL2 is formed.

Then, a second embodiment of the present invention will be described. In the first embodiment, the memory array is constituted by shared bit lines, but in the second embodiment, the memory array is constituted by shared source lines.

Figure 12:
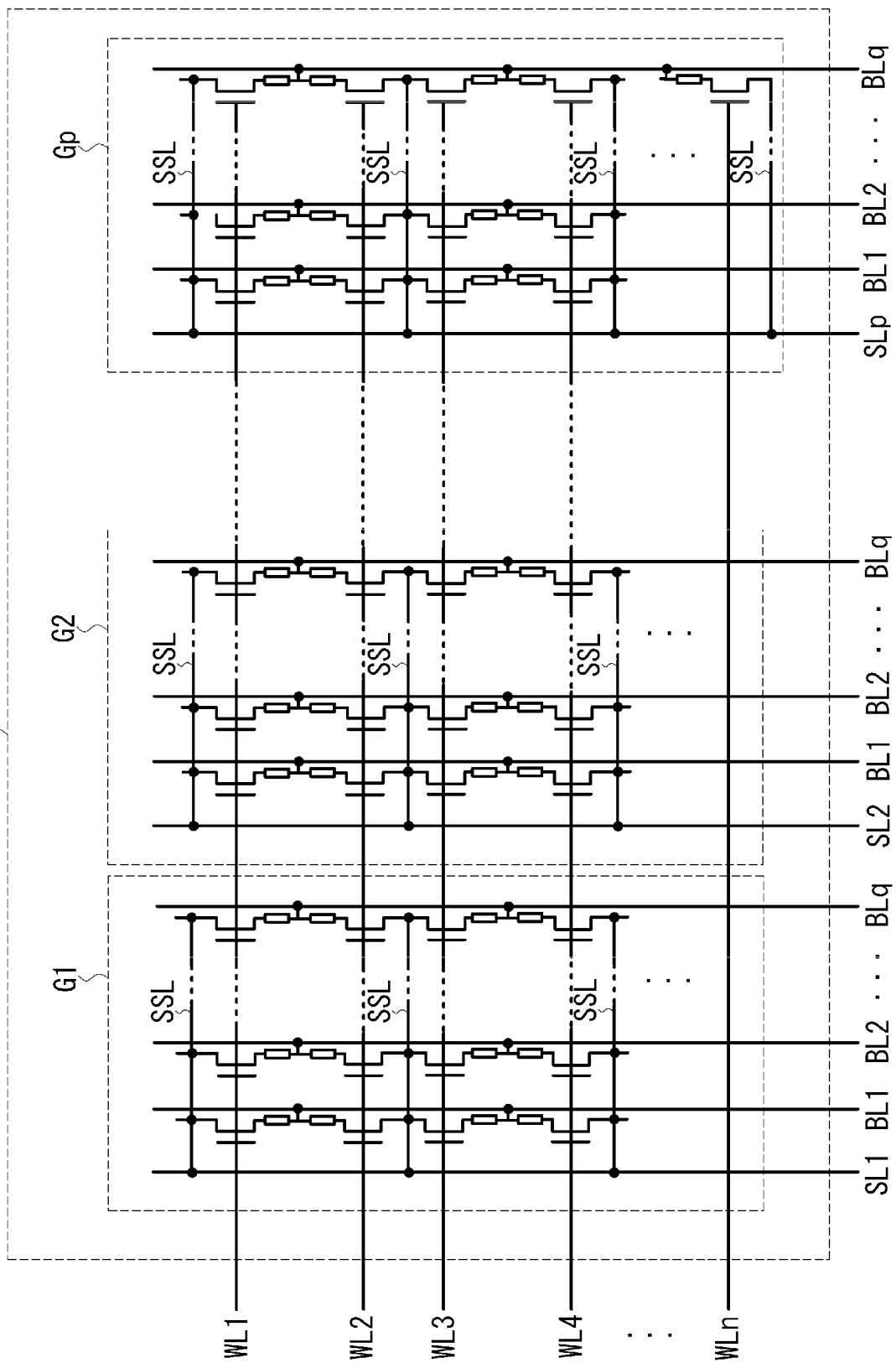
FIG. 12 is a circuit diagram showing a memory array having shared bit lines according to a second embodiment of the present invention.

Referring to FIG. 12, in the second embodiment, the local bit lines BL and the local bit lines SL shown in the first embodiment are disposed inversely. That is, the local source lines SL1, SL2, SLq are respectively assigned to the groups G1~Gp, and for one bit line SL, a plurality of shared source lines SSL extending in parallel with the word lines are to the bit line SL. Each shared source line SSL is connected to the variable resistance elements of pairs of memory cells in the row direction, so that a short circuit is made between q nodes in the row direction to which the variable resistance elements of those pairs of memory cells are commonly connected If there are n word lines in one group, n/2 shared source lines SSL are formed in same group (or in the cases where each shared source SSL is formed for the memory cells on the same row, there n shared source lines). One local bit line BL is commonly connected to the variable-resistance-element side of the memory cells in the column direction.

Figure 13A:
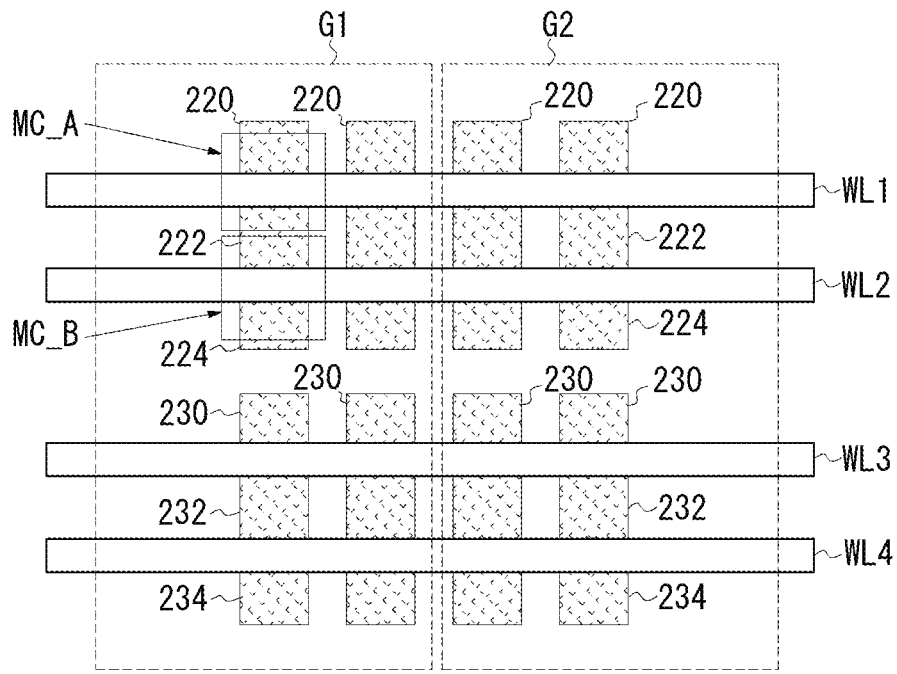
Figure 13B:
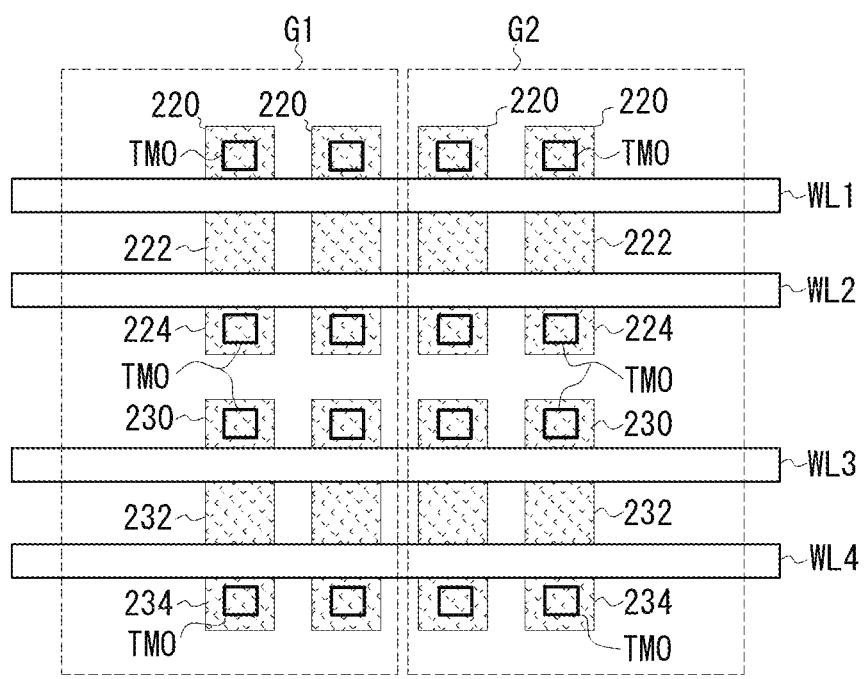
Figure 14A:
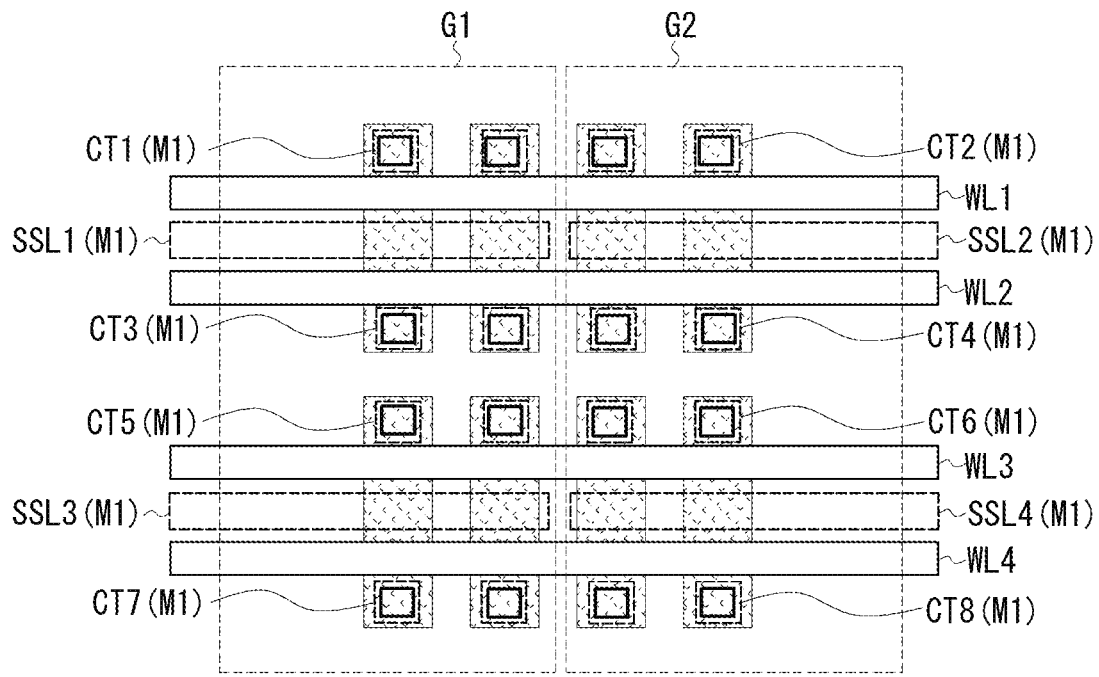
FIG. 14A is a plan view showing that a first metal layer M1 has been formed.
Figure 15A:
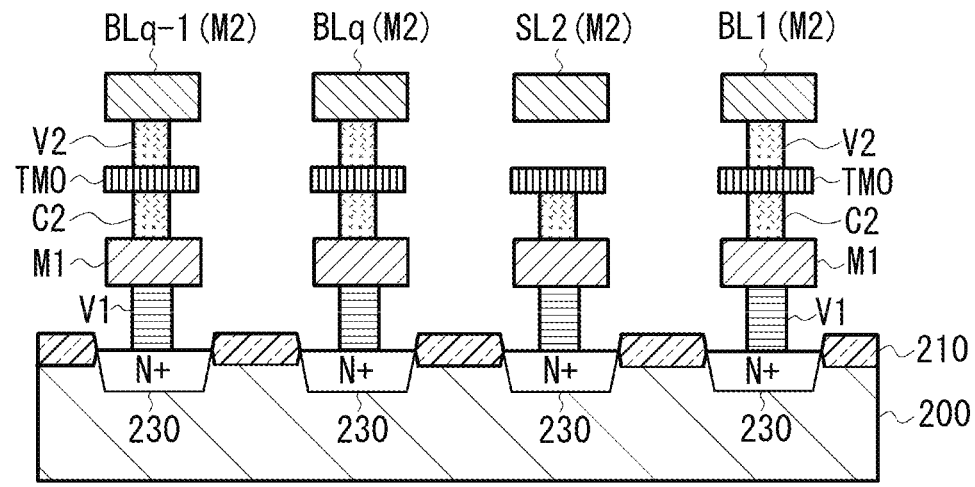
FIG. 15A is a cross-sectional view taken along a line X1-X1 of FIG. 14B.
Figure 15B:
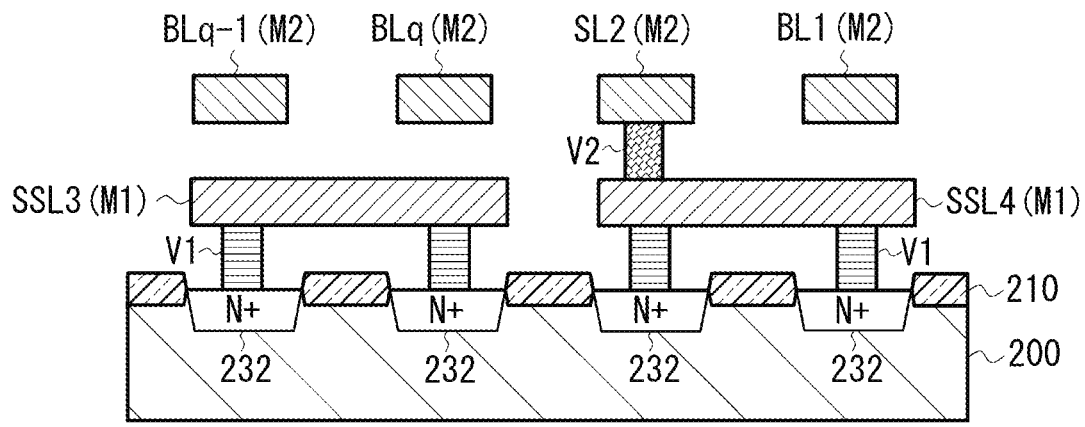
FIG. 15B is a cross-sectional view taken along a line X2-X2 of FIG. 14B.
Figure 16A:
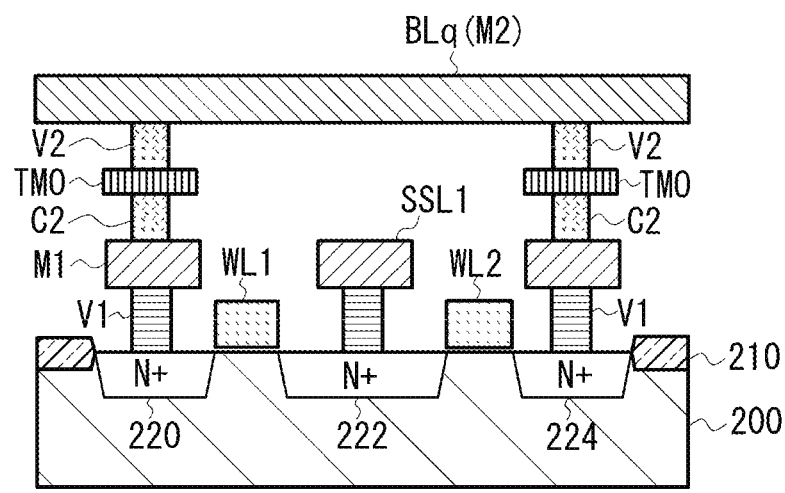
FIG. 16A is a cross-sectional view taken along a line Y1-Y1 of FIG. 14B.
Figure 16B:
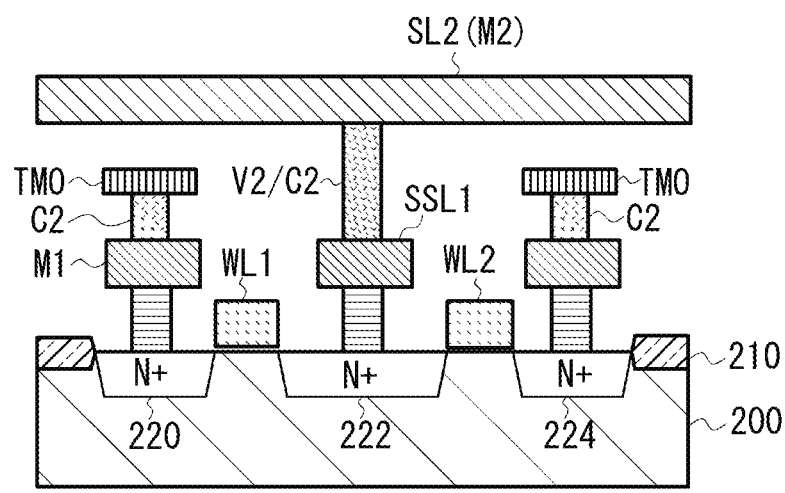
FIG. 16B is a cross-sectional view taken along a line Y2-Y2 of FIG. 14B.

FIGS. 13A, 13B, 14A, and 14B are plan views of the memory array of the second embodiment (corresponding to FIGS. 4A, 4B, 5A, and 5B of the first embodiment. FIGS. 15A and 15B are cross-sectional views taken along lines X1-X1 and X2-X2 of FIG. 14B. FIGS. 16A and 16B are cross-sectional views taken along lines Y1-Y1 and Y2-Y2 of FIG. 14B.

As shown in the FIGS. 13A and 13B, the process occurred before the formation of the polysilicon layer and the transition metal oxide TMO is the same as that in the first embodiment. Next, as shown in FIG. 14A, the shared source lines SSL1, SSL2, SSL3, and SSL4 extending in the row direction are formed on the first metal layer M1 and above the diffusion regions 222 and 232, and the relay contacts CT1, CT2, CT3, CT4, CT5, CT6, CT7, and CT8 are formed above the diffusion regions 220, 224, 230, and 234.

Figure 14B:
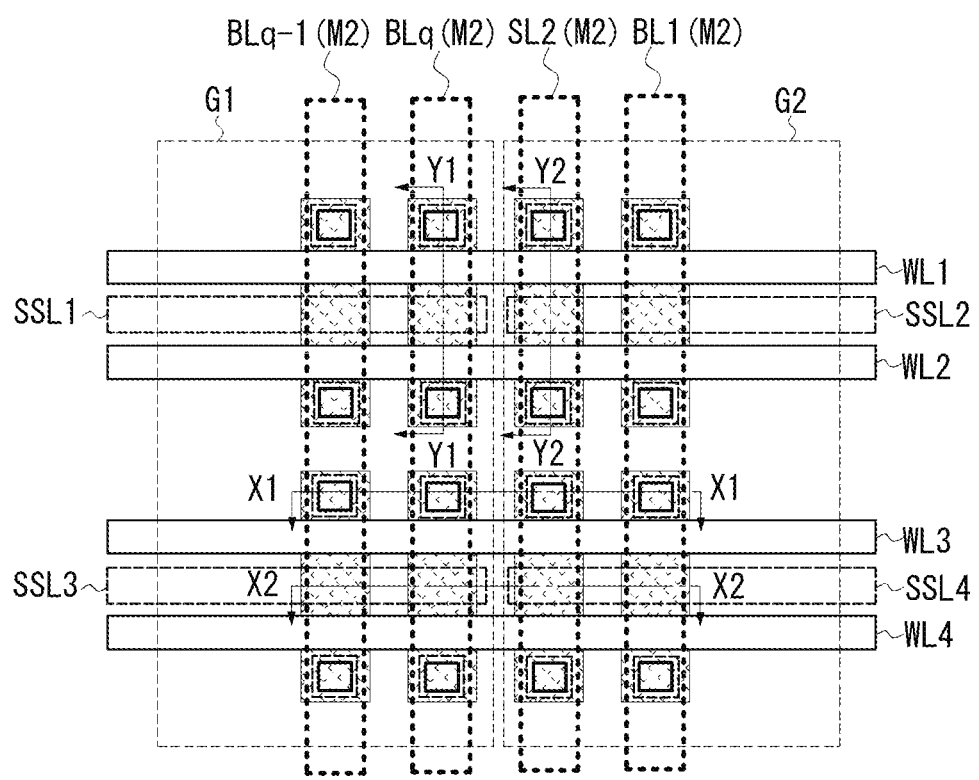
FIG. 14B is a plan view showing that a second metal layer M2 has been formed.

Next, as shown in FIG. 14B, a second metal layer M2 which is an upper layer than the metal layer M1 is formed. The metal layer M2 extends in a strip shape in the column direction to form a local bit line BL and a local source line SL. The local bit lines BLq−1 and BLq of the group G1 and the local source line SL2 and the local bit line BL1 of the group G2 are shown in the figures.

As shown in FIGS. 15A, 15B, 16A, and 16B, the local bit lines BLq−1, BLq, and BL1 are connected to the transition metal oxide TMO through the via contacts V2. On the other hand, the local source line SL2 is connected to the shared source lines SSL2 and SSL4 through the via contacts V2, but is not connected to the transition metal oxide TMO. The other shared source lines SSL1 and SSL3 are connected to the local source line SL1 of the group G1. In addition, since the read operation, the write operation, and the like are the same as those in the first embodiment, the description thereof is omitted.

As described above, the local source line SL2 is electrically connected to the shared source lines SSL2 and SSL4, and it is not necessary that the local source line SL2 is connected to a metal layer or a transition metal oxide other than the above. That is, the local source line SL2 is a dummy column line, and the memory cells located below the local source line SL2 are dummy memory cells without functional. In this example, since no via contacts V2 are formed between the local source line SL2 and the transition metal oxide TMO, there is no contact between the local source line SL2 and the memory cells which are disposed directly below the local source line SL2, however, this structure is just an example. In another embodiment, other via contacts can be removed to make the local source line SL2 not contact with the memory cells which are disposed directly below it.

Figure 17:
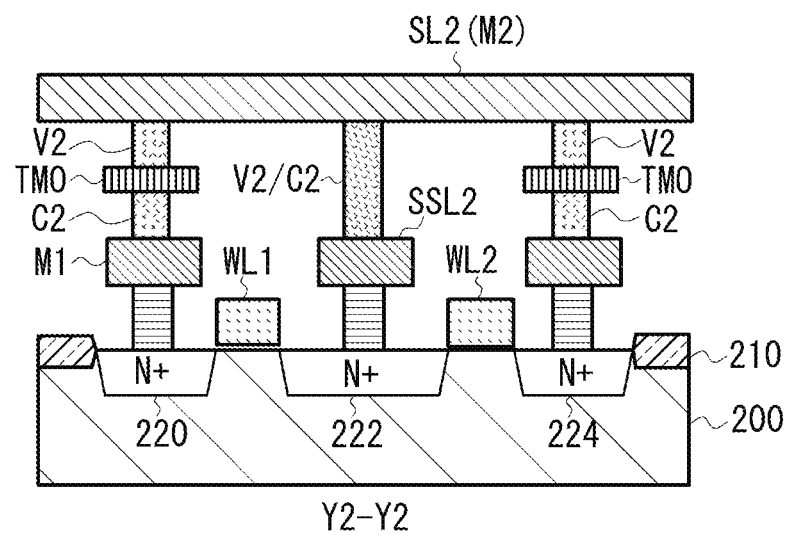
FIG. 17 is a view showing a modification of a dummy line for shared source lines in the second embodiment of the present invention.

FIG. 17 is a cross-sectional view (line Y2-Y2) showing a modification of the second embodiment. In the above embodiment, since the local source line is separated from the memory cells which are disposed directly below the local source line, the via contacts V2/C2 are not formed. In this case, if the via contacts are not formed in a partial area of the memory array, there is a possibility that the dimensional accuracy of the surrounding memory cells is adversely affected. Therefore, in the modification, as shown in FIG. 17, the local source line SL2 is connected to the memory cells, which are disposed below the local source line SL2, through the via contacts V2/C2 whose size is the same as the memory cells. That is, there is a short circuit formed between the local source line SL2 and the transition metal oxide TMO through the via contacts V2, so that, the formation of the memory cells including the dummy cell can be made uniform. Since there is a short circuit formed between the corresponding bit line and source line, the dummy memory cell does not affect the write operation and the read operation. Also, the dummy memory cell can obtain a special effect as follows: the damage of the transition metal oxide TMO can be reduced by the diffusion of the source line, wherein the damage of the transition metal oxide TMO is caused by the charge convergence due to the antenna effect which is induced when the local bit line BL2 is formed.

According to the embodiment, a plurality of shared source lines connected to the local source line share one source line, so that the number of source lines in the column direction is reduced. Moreover, the line width of the local bit lines and the line width of the local source lines can be increased, thereby decreasing the line resistance. Thus, uniform voltage pulses can be applied to the memory cells, thereby reliably performing the write operation, the read operation, and the like.

In the first and second embodiments, an example in which one sub-array is divided into a plurality of groups is shown, but the present invention is not necessarily limited to such a configuration. For example, it is also possible that one sub-array is equivalent to one group. In this case, the resistive memory 100 accesses the memory cells by taking one sub-array as a unit, and the unselected sub-array and the related circuits (such as the sense amplifiers) of the unselected sub-arrays can be disabled.

The present invention also provides the first embodiment in which one local bit line is allocated in one group in the first embodiment and the second embodiment in which one local source line is allocated in one group, however, they are examples for illustration. In other embodiments, it is also possible to allocate a plurality of local bit lines or a plurality of local source lines in on group. For example, in the embodiment shown in FIG. 3, two local bit lines may be allocated to the leftmost side and the rightmost side of the group G1. In this case, the local bit line on the leftmost side is connected to the first shared bit line, and the local bit line on the rightmost side is connected to the second shared bit line, the first shared bit line is shared by q/2 memory cells in the row direction, and the second shared bit line is shared by q/2 memory cells in the row direction. Accordingly, compared with the case in which one shared bit line is shared by q memory cells in the row direction, the load capacitance of the above example can be reduced.

In the first embodiment, a memory array having a multilayer wiring structure having three metal layers is provided, and in the second embodiment, a memory array having a multilayer wiring structure having two metal layers is provides, however, they are examples for illustration. The number of stacked metal layers can also be more than the above embodiments. Further, the material of the metal layers is not particularly limited, and any material can be used. Further, if there is no hindrance in manufacturing, a conductive polysilicon layer or a stacked structure composed of a polysilicon layer and a metal layer with a high melting point can be used to replace each of the metal layers. Further, the invention can be applied to not only the array structure of the resistance random access memory, but also the array structures of other memories such as MRAM, PRAM, and FRAM. In these cases, the same effect can be obtained.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive memory comprising:
    an array area in which a plurality of memory cells arranged in a matrix, wherein each of the plurality of memory cells comprises a variable resistance element and an accessing transistor connected to the variable resistance element;
    a plurality of word lines extending in a row direction of the array area and connected to the memory cells in the row direction;
    at least one bit line extending in a column direction of the array area;
    a plurality of source lines extending in the column direction of the array area and connected to first electrodes of the memory cells in the column direction; and
    a shared bit line connected to the at least one bit line, extending in the row direction of the array area, and connected to second electrodes of the memory cells in the row direction,
    wherein the at least one bit line operates as a dummy bit line.

2. The resistive memory as claimed in claim 1, wherein the at least one bit line is separated from the memory cells disposed directly below the at least one bit line.

3. The resistive memory as claimed in claim 1, wherein there is a short circuit formed between the at least one bit line and the memory cells disposed directly below the at least one bit line.

4. The resistive memory as claimed in claim 1, wherein the shared bit line is extended in parallel with the plurality of word lines.

5. The resistive memory as claimed in claim 1, wherein when the plurality of memory cells of the array area are arranged on n rows and q columns, the shared bit line is shared by q memory cells in the row direction.

6. The resistive memory as claimed in claim 1, wherein the array area is one of a plurality of areas which are obtained by dividing a memory array.

7. The resistive memory as claimed in claim 1, wherein the at least one bit line and the plurality of source lines are formed by a first wiring layer, and the shared bit line is formed by a second wiring layer lower than the first wiring layer.

8. A resistive memory comprising:
- an array area in which a plurality of memory cells arranged in a matrix, wherein each of the plurality of memory cells comprises an accessing transistor connected to a first electrode of the memory cell and a variable resistance element connected between the accessing transistor and a second electrode of the memory cell;
- a plurality of word lines extending in a row direction of the array area and connected to the memory cells in the row direction;
- at least one bit line extending in a column direction of the array area;
- a plurality of source lines extending in the column direction of the array area and connected to first electrodes of the memory cells in the column direction; and
- a shared bit line connected to the at least one bit line, extending in the row direction of the array area, and connected to second electrodes of the memory cells in the row direction.

9. The resistive memory as claimed in claim 8, wherein the at least one bit line operates as a dummy bit line.

10. The resistive memory as claimed in claim 9, wherein the at least one bit line is separated from the memory cells disposed directly below the at least one bit line.

11. The resistive memory as claimed in claim 8 further comprising:
- a memory array divided into at least two areas,
- wherein the array area is one of the least two areas.

* * * * *